(12) United States Patent
Akiyama et al.

(10) Patent No.: US 12,376,458 B2
(45) Date of Patent: Jul. 29, 2025

(54) ORGANIC EL ELEMENT, ORGANIC EL PANEL, AND ORGANIC EL ELEMENT MANUFACTURING METHOD

(71) Applicant: JDI Design and Development G.K., Tokyo (JP)

(72) Inventors: Toshiyuki Akiyama, Tokyo (JP); Shinichiro Ishino, Tokyo (JP); Yasuhiro Sekimoto, Tokyo (JP); Muneharu Sato, Tokyo (JP); Takeshi Kamiya, Tokyo (JP); Tomohiko Oda, Tokyo (JP); Mineki Hasegawa, Tokyo (JP); Masakazu Takata, Tokyo (JP)

(73) Assignee: JDI DESIGN AND DEVELOPMENT G.K., Tokyo (JP)

( * ) Notice: Subject to any disclaimer, the term of this patent is extended or adjusted under 35 U.S.C. 154(b) by 868 days.

(21) Appl. No.: 17/529,277

(22) Filed: Nov. 18, 2021

(65) Prior Publication Data
US 2022/0158112 A1 May 19, 2022

(30) Foreign Application Priority Data

Nov. 18, 2020 (JP) .................................. 2020-191806
Nov. 15, 2021 (JP) .................................. 2021-185923

(51) Int. Cl.
*H10K 59/122* (2023.01)
*H10K 50/11* (2023.01)
(Continued)

(52) U.S. Cl.
CPC ........... *H10K 59/122* (2023.02); *H10K 50/11* (2023.02); *H10K 50/818* (2023.02);
(Continued)

(58) Field of Classification Search
CPC ....................... H10K 2101/40; H10K 2101/30
See application file for complete search history.

(56) References Cited

U.S. PATENT DOCUMENTS

| 6,703,146 B1 | 3/2004 | Sakaguchi et al. |
| 2007/0241676 A1 | 10/2007 | Park et al. |

(Continued)

FOREIGN PATENT DOCUMENTS

| JP | 2001-085166 A | 3/2001 |
| JP | 2007-287691 A | 11/2007 |

(Continued)

OTHER PUBLICATIONS

D. Y. Kondakov, et al., "Operational degradation of organic light-emitting diodes: Mechanism and identification of chemical products", Journal of Applied Physics 101, 024512 (2007), Published Online: Jan. 24, 2007, 2 pages. (English Abstract only).

(Continued)

*Primary Examiner* — Jenna N Chandhok
(74) *Attorney, Agent, or Firm* — XSENSUS LLP

(57) ABSTRACT

An organic EL element including an anode, a first functional layer including organic material, disposed above the anode, a second functional layer including organic material, disposed on and in contact with the first functional layer, a light emitting layer disposed on and in contact with the second functional layer, and a cathode disposed above the light emitting layer. A highest occupied molecular orbital (HOMO) level of the organic material of the second functional layer has an energy level at least 0.2 eV lower than that of a HOMO level of the organic material of the first functional layer, and film thickness of the second functional layer is 15 nm or less.

9 Claims, 15 Drawing Sheets

(51) Int. Cl.
*H10K 50/818* (2023.01)
*H10K 59/80* (2023.01)
*H10K 71/00* (2023.01)
*H10K 101/10* (2023.01)
*H10K 101/40* (2023.01)
*H10K 102/10* (2023.01)

(52) U.S. Cl.
CPC ..... *H10K 59/80518* (2023.02); *H10K 59/876* (2023.02); *H10K 71/00* (2023.02); *H10K 2101/10* (2023.02); *H10K 2101/40* (2023.02); *H10K 2102/102* (2023.02); *H10K 2102/103* (2023.02)

(56) References Cited

U.S. PATENT DOCUMENTS

| | | | |
|---|---|---|---|
| 2012/0267619 A1 | 10/2012 | Yamada et al. | |
| 2016/0365527 A1* | 12/2016 | Gao | H10K 50/17 |
| 2019/0131558 A1* | 5/2019 | Mishima | H10K 50/166 |
| 2021/0305533 A1* | 9/2021 | Tsukamoto | C23C 14/00 |
| 2022/0029119 A1* | 1/2022 | Zhang | H10K 50/18 |
| 2022/0344599 A1* | 10/2022 | Sakai | C07F 1/005 |
| 2023/0111469 A1* | 4/2023 | Park | H10K 85/631 |
| | | | 313/503 |
| 2023/0380262 A1* | 11/2023 | Kim | H10K 85/654 |
| 2024/0224787 A1* | 7/2024 | Kang | H10K 85/615 |

FOREIGN PATENT DOCUMENTS

| | | |
|---|---|---|
| JP | 2009-267392 A | 11/2009 |
| WO | 2011/092939 A1 | 8/2011 |

OTHER PUBLICATIONS

N. C. Giebink, et al., "Intrinsic luminance loss in phosphorescent small-molecule organic light emitting devices due to bimolecular annihilation reactions", Journal of Applied Physics 103, 044509 (2008), Published Online: Feb. 28, 2008, 2 pages. (English Abstract only).

* cited by examiner ered across the electrodes, holes
ORGANIC EL ELEMENT, ORGANIC EL PANEL, AND ORGANIC EL ELEMENT MANUFACTURING METHOD This application claims priority to Japanese Patent Application No. 2020-191806 filed Nov. 18, 2020, and Japanese Patent Application No. 2021-185923 filed Nov. 15, 2021, the contents of which are hereby incorporated by reference in their entirety.

BACKGROUND

Technical Field

The present disclosure relates to suppressing an increase in drive voltage and improving the life of an organic electroluminescence (EL) element using carrier injection material.

Description of Related Art

In recent years, display device using organic EL elements that utilize electroluminescence of organic materials are becoming widespread.

An organic EL element has a basic structure in which a light emitting layer is disposed between a pair of electrodes, and when a voltage is applied across the electrodes, holes and electrons are recombined such that the light emitting layer emits light. More specifically, holes are injected into the light emitting layer from an anode, electrons are injected into the light emitting layer from a cathode, and the holes and electrons are recombined in the light emitting layer. In many cases, a difference between a Fermi level of the cathode material and an energy level of a lowest unoccupied molecular orbital (LUMO) of the light emitting material in the light emitting layer is large. Therefore, in order to facilitate injection of electrons from a cathode into a light emitting layer, a structure is used in which a functional layer containing a metal material having a low work function is provided between the cathode and the light emitting layer. Similarly, in order to facilitate injection of holes from the anode into the light emitting layer, a structure is used in which a functional layer containing a material having a hole injecting property is provided between the anode and the light emitting layer. Further, a structure in which a layer is provided between the cathode and the light emitting layer for suppressing outflow of holes from the light emitting layer to the cathode, and a structure in which a layer is provided between the anode and the light emitting layer for suppressing outflow of electrons from the light emitting layer to the anode may be used (for example, JP 2009-267392, JP 2001-85166, WO 2011/92939).

SUMMARY

An organic EL element pertaining to an aspect of the present disclosure is an organic EL element including an anode, a first functional layer including organic material, disposed above the anode, a second functional layer including organic material, disposed on and in contact with the first functional layer, a light emitting layer disposed on and in contact with the second functional layer, and a cathode disposed above the light emitting layer. A highest occupied molecular orbital (HOMO) level of the organic material of the second functional layer has an energy level at least 0.2 eV lower than that of a HOMO level of the organic material of the first functional layer, and film thickness of the second functional layer is 15 nm or less.

BRIEF DESCRIPTION OF DRAWINGS

FIG. 10A illustrates a state in which a TFT layer is formed on a substrate, FIG. 10B illustrates a state in which an interlayer insulating layer is formed on the substrate, FIG. 10C illustrates a state in which pixel electrode material is formed on the interlayer insulating layer, FIG. 10D illustrates a state in which pixel electrodes are formed, and FIG. 10E illustrates a state in which a bank material layer is formed on the interlayer insulating layer and the pixel electrodes.

FIG. 11A illustrates a state in which banks are formed, FIG. 11B illustrates a state in which hole injection layers are formed on the pixel electrodes, and FIG. 11C illustrates a state in which hole transport layers are formed on the hole injection layers.

FIG. 12A illustrates a state in which light emitting layers are formed on the hole transport layers, FIG. 12B illustrates a state in which a first electron transport layer is formed on the light emitting layers and the banks, and FIG. 12C illustrates a state in which a second electron transport layer is formed on the first electron transport layer.

FIG. 13A illustrates a state in which an optical adjustment layer is formed on the second electron transport layer, FIG. 13B illustrates a state in which a counter electrode is formed on the optical adjustment layer, and FIG. 13C illustrates a state in which a sealing layer is formed on the counter electrode.

DETAILED DESCRIPTION

Figure 1:
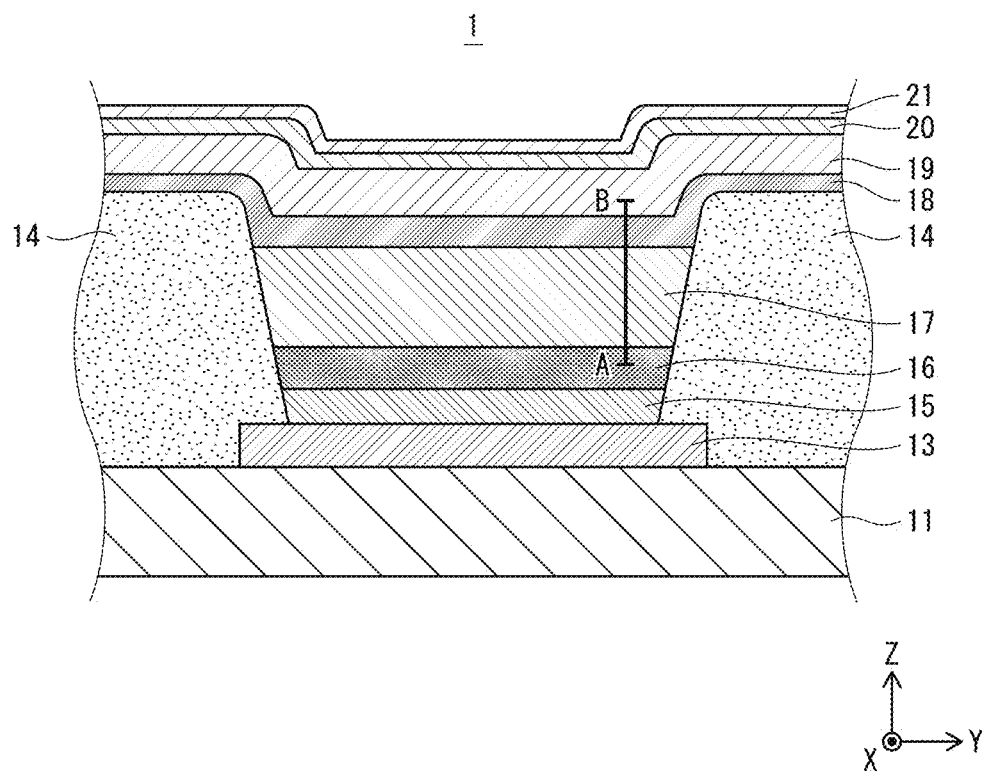
FIG. 1 is a cross section diagram schematically illustrating structure of an organic EL element 1 according to at least one embodiment.

Background to an Aspect of the Present Disclosure

In order to efficiently recombine in the light emitting layer of an organic electroluminescence (EL) element, it is necessary to increase density of carriers (electrons and/or holes) in the light emitting layer, and therefore typically, carrier density and exciton density are increased at a cathode side interface and/or anode side interface of the light emitting layer. Therefore, exciton density tends to increase in a functional layer due to movement of excitons from the light emitting layer to the functional layer or generation of excitons in the functional layer due to leakage of carriers from the light emitting layer. Subsequently, energy of the excitons is transferred to polarons, which are carriers in functional layer material, such that the polarons became high energy and chemical bonds in the functional layer material are destroyed, generating dissociation products, causing technical problems that carrier transportability of the functional layer deteriorates and further deteriorates due to dissociation product forming carrier traps and quenching sites (for examples "Operational degradation of organic light-emitting diodes: Mechanism and identification of chemical products", D. Y. Kondakov, et al., JOURNAL OF APPLIED PHYSICS 101, 024512 (2007), and "Intrinsic luminance loss in phosphorescent small-molecule organic light emitting devices due to bimolecular annihilation reactions", N. C. Giebink, et al., JOURNAL OF APPLIED PHYSICS 103, 044509 (2008)).

The present disclosure is made in view of the above technical problems, and an object of the present disclosure is to provide an organic EL element, an organic EL panel, and an organic EL element manufacturing method that increase lifespan by suppressing deterioration of a functional layer caused by a deactivation reaction between carriers and excitons.

Aspects of Disclosure

An organic EL element pertaining to at least one aspect of the present disclosure is an organic EL element including an anode, a first functional layer including organic material, disposed above the anode, a second functional layer including organic material, disposed on and in contact with the first functional layer, a light emitting layer disposed on and in contact with the second functional layer, and a cathode disposed above the light emitting layer. A highest occupied molecular orbital (HOMO) level of the organic material of the second functional layer has an energy level at least 0.2 eV lower than that of a HOMO level of the organic material of the first functional layer, and film thickness of the second functional layer is 15 nm or less.

An organic EL element manufacturing method pertaining to at least one aspect of the present disclosure is a manufacturing method including forming an anode on a substrate, forming a first functional layer including organic material, above the anode, forming a second functional layer including organic material, on and in contact with the first functional layer, forming a light emitting layer on and in contact with the second functional layer; and forming a cathode above the light emitting layer. A HOMO level of the organic material of the second functional layer is made to have an energy level at least 0.2 eV lower than that of a HOMO level of the organic material of the first functional layer, and film thickness of the second functional layer is made to be 15 nm or less.

According to the organic EL element and the manufacturing method each pertaining to at least one aspect of the present disclosure, hole injectability from the first functional layer to the second functional layer is decreased, and therefore hole density in the second functional layer can be reduced. Therefore, in the second functional layer, a deactivation reaction between holes and excitons can be suppressed, and deterioration of the functional layer can be suppressed, and therefore an extension in life of the organic EL element can be expected. Further, by limiting film thickness of the second functional layer, it is possible to suppress an increase in drive voltage even if hole injection property from the first functional layer to the second functional layer is decreased.

According to at least one embodiment, hole mobility of the second functional layer is at least $1 \times 10^{-9}$ cm$^2$/Vs.

According to this structure, the organic EL element has sufficiently high hole mobility and low impedance of the second functional layer, and therefore by setting film thickness of the second functional layer to 15 nm or less, drive voltage of the organic EL element can be reduced.

According to at least one embodiment, electron mobility in the light emitting layer is larger than hole mobility in the light emitting layer.

According to this structure, the organic EL element has high luminance efficiency because exciton density is high in the light emitting layer at the interface with the second functional layer, and life can be extended because deterioration of the second functional layer caused by coupling of excitons and holes can be suppressed.

According to at least one embodiment, energy of singlet excitons in the organic material of the second functional layer is larger than energy of singlet excitons in functional material included in the light emitting layer.

According to this structure, the organic EL element can prevent singlet excitons in the light emitting layer from moving to the second functional layer, and therefore a decrease in luminance efficiency can be suppressed, and deterioration of the second functional layer can be suppressed, leading to an increase in life of the organic EL element.

According to at least one embodiment, energy of triplet excitons in the organic material of the second functional layer is larger than energy of triplet excitons in functional material included in the light emitting layer.

According to this structure, the organic EL element can prevent triplet excitons in the light emitting layer from moving to the second functional layer, and therefore deterioration of the second functional layer can be suppressed, leading to an increase in life of the organic EL element.

According to at least one embodiment, the anode is a light reflective electrode, and a distance between a light emitting layer side surface of the anode and an anode side surface of the light emitting layer is 40 nm or less.

According to this structure, light extraction efficiency of the organic EL element can be improved.

According to at least one embodiment, an optical cavity structure including a light transmissive layer is formed between the light emitting layer side surface of the anode and the light emitting layer side surface of the cathode, and the light transmissive layer includes indium tin oxide (ITO) or indium zinc oxide (IZO).

According to this structure, an optical cavity structure can be easily implemented while optimally designing thicknesses of each functional layer between the cathode and anode, in order to easily achieve improvements in luminance efficiency and light extraction efficiency.

According to at least one embodiment, the HOMO level of the organic material of the second functional layer has an energy level no more than 0.6 eV lower than that of the HOMO level of the organic material of the first functional layer, and the film thickness of the second functional layer is 5 nm or more.

According to this structure, the organic EL element can secure a current density required for an organic EL element and can satisfy a dielectric breakdown field strength of organic semiconductor material constituting the second functional layer. The second functional layer can be formed using a thin film organic semiconductor, and dielectric strength and carrier transport and injection properties can be secured.

An organic EL display panel according to at least one embodiment is an organic EL display panel including a plurality of the organic EL elements disposed on a substrate.

Embodiments

The following describes an organic EL element according to at least one embodiment. The following description is of an illustrative example for explaining structure, action, and effect pertaining to an aspect of the present invention, and does not limit the present invention to the embodiments described, except for essential elements of the present invention.

1. Organic EL Element Structure

FIG. 1 is a cross section diagram schematically illustrating structure of an organic EL element 1 according to at least one embodiment. The organic EL element 1 includes a pixel electrode 13 that is an anode, a hole injection layer 15, a hole transport layer 16, a light emitting layer 17, a first electron transport layer 18, a second electron transport layer 19, an optical adjustment layer 20, and a counter electrode 21 that is a cathode.

In the organic EL element 1, the pixel electrode 13 and the counter electrode 21 are arranged such that their respective main surfaces face each other, either side of the light emitting layer 17.

On a side of the light emitting layer 17 nearest the pixel electrode 13, the hole transport layer 16 is in contact with the light emitting layer 17. On a side of the hole transport layer 16 nearest the pixel electrode 13, the hole injection layer 15 is in contact with the hole transport layer 16.

On a side of the light emitting layer 17 nearest the counter electrode 21, the first electron transport layer 18 is in contact with the light emitting layer 17. On a side of the first electron transport layer 18 nearest the counter electrode 21, the second electron transport layer 19 is in contact with the first electron transport layer 18. The optical adjustment layer 20 is disposed between the second electron transport layer 19 and the counter electrode 21.

1.1 Organic EL Element Structural Elements

<Pixel Electrode>

The pixel electrode 13 is formed on an interlayer insulating layer 12. The pixel electrode 13 is provided in a plurality, in one-to-one correspondence with pixels, and each of the pixel electrode 13 is electrically connected to a thin film transistor (TFT) layer 112 through a contact hole provided in the interlayer insulating layer 12.

According to at least one embodiment, the pixel electrode 13 functions as an anode.

Specific examples of metal material having light reflectivity include silver (Ag), aluminum (Al), aluminum alloy, molybdenum (Mo), alloy of silver, palladium, and copper (APC), alloy of silver, rubidium, and gold (ARA), alloy of molybdenum and chromium (MoCr), alloy of molybdenum and tungsten (MoW), alloy of nickel and chromium (NiCr), and the like.

The pixel electrode 13 may be composed of a single metal layer, or may be a laminated structure in which a layer made of metal oxide such as indium tin oxide (ITO) or indium zinc oxide (IZO) is laminated on a metal layer.

When the counter electrode 21 is a light reflecting electrode, the pixel electrode 13 may be a light transmissive electrode. In this case, the pixel electrode 13 includes at least one of a metal layer formed of a metal material and a metal oxide layer formed of a metal oxide. Film thickness of the pixel electrode 13 is set to be thin, from about 1 nm to 50 nm, to be light transmissive. Metal material is light reflective material, but light transmission can be ensured by making the thin film of the metal layer 50 nm or less. Accordingly, some light from the light emitting layer 17 is reflected by the pixel electrode 13, but a remainder is transmitted through the pixel electrode 13.

Examples of metal material forming the metal layer included in the pixel electrode 13 include Ag, a silver alloy that is mainly Ag, Al, and an Al alloy that is mainly Al. Examples of Ag alloy include magnesium silver alloy (MgAg) and indium silver alloy. Ag has low resistivity, and Ag alloy is preferable in that it has excellent heat resistance and corrosion resistance, and can maintain good electrical conductivity for a long period of time. Examples of Al alloy include magnesium aluminum alloy (MgAl) and lithium aluminum alloy (LiAl). Examples of other alloys include lithium magnesium alloy and lithium indium alloy.

The metal layer included in the pixel electrode 13 may be, for example, a single Ag layer or MgAg layer, a laminated structure of an Mg layer and an Ag layer (Mg/Ag), or a laminated structure of an MgAg alloy layer and an Ag layer (MgAg/Ag).

Examples of metal oxides forming the metal oxide layer included in the pixel electrode 13 include indium tin oxide (ITO) and zinc oxide (IZO).

Further, the pixel electrode 13 may be composed of a single metal layer or a single metal oxide layer, or may have a laminated structure in which the metal oxide layer is laminated on the metal layer, or the metal layer laminated on the metal oxide layer.

<Hole Injection Layer>

The hole injection layer 15 has a function of promoting injection of holes from the pixel electrode 13 that is an anode into the light emitting layer 17. The hole injection layer 15 is formed by, for example, applying and drying a solution of a hole injection material and a solute. The hole injection layer 15 is made of an electrically conductive polymer material such as poly(3,4-ethylenedioxythiophene) polystyrene sulfonate (PEDOT:PSS), polyfluorene, or a polyfluorene derivative. As described later, material of the hole injection layer 15 is selected such that the highest occupied molecular orbital (HOMO) level of material of the hole injection layer 15 is 0.2 eV or more higher (at close to vacuum level) than the HOMO level of material of the hole transport layer 16. Further, according to at least one embodiment, film thickness of the hole injection layer 15 is 10 nm.

Further, an inorganic layer having a hole injection property may be provided between the hole injection layer 15 and the pixel electrode 13. As the inorganic layer, for example, oxides such as Ag, Mo, chromium (Cr), vanadium (V), tungsten (W), nickel (Ni), iridium (Ir), and the like can be used.

<Hole Transport Layer>

The hole transport layer 16 has a function of transporting holes injected from the hole injection layer 15 to the light emitting layer 17. The hole transport layer 16 is formed by, for example, applying and drying a solution of a hole transport material and a solute. The hole transport layer 16 is made of, for example, a polymer compound such as polyfluorene, a polyfluorene derivative, polyarylamine, or a polyarylamine derivative, and does not have a hydrophilic group. Material of the hole transport layer 16 is selected such that the HOMO level of material of the hole transport layer 16 is 0.2 eV or more lower than the HOMO level of material of the hole injection layer 16. Further, according to at least one embodiment, film thickness of the hole transport layer 16 is 15 nm.

When hole mobility of the hole transport layer 16 is low, impedance of the hole transport layer 16 tends to increase and drive voltage of the organic EL element 1 tends to increase. Accordingly, in order to suppress an increase in drive voltage of the organic EL element 1, hole mobility of the hole transport layer 16 is preferably $1 \times 10^{-9}$ cm$^2$/Vs or more.

Further, movement of excitons from the light emitting layer 17 to the hole transport layer 16 due to exciton energy of light emitting material of the light emitting layer 17 being transferred to hole transport material of the hole transport layer 16 is not desirable, as it causes both a decrease in light emission efficiency and deterioration of hole transport material of the hole transport layer 16. Accordingly, energy S1(htl) of singlet excitons of hole transport material of the hole transport layer 16 is preferably larger than energy S1(eml) of singlet excitons of light emitting material of the light emitting layer 17. Similarly, energy of triplet excitons of hole transport material of the hole transport layer 16 is preferably larger than energy of triplet excitons of light emitting material of the light emitting layer 17.

In order not to make the optical path length between a light emission center and the pixel electrode 13 excessive in forming an optical cavity structure, total thickness of functional layers between the pixel electrode 13 and the light emitting layer 17, that is, total thickness of the hole injection layer 15 and the hole transport layer 16, is preferably 40 nm or less.

Further, film thickness of the hole transport layer 16 is preferably 5 nm or more. The hole transport layer 16 is composed of a thin film of a polycrystalline or amorphous organic semiconductor. Polycrystals are composed of small crystals of sizes from several nanometers to several millimeters. In order to use a thin film of an organic semiconductor as the hole transport layer 16 and obtain electrical functions such as dielectric strength and carrier transport/injectability, the thin film is composed of relatively fine crystals, and a minimum film thickness of about 5 nm is required for the hole transport layer 16.

Therefore, by setting film thickness of the hole transport layer 16 to 5 nm or more, the hole transport layer 16 is structured as an organic thin film semiconductor, and dielectric strength and carrier transport/injection properties can be ensured.

The hole transport layer 16 is not limited to being an applied film, and may be a vapor deposited thin film.

<Light Emitting Layer>

The light emitting layer 17 has a function of emitting light by recombination of holes and electrons. The light emitting layer 17 is, for example, an applied film formed by, for example, applying and drying a solution of a material to form a light emitting layer and a solute. The light emitting layer 17 may be formed by vapor deposition.

Further, it is preferable that at least one of electron mobility and hole mobility of the light emitting layer 17 is large, in terms of increasing excitons. Further, when electron mobility in the light emitting layer 17 is higher than hole mobility, density of excitons is high at a side of the light emitting layer 17 that interfaces with the hole transport layer 16, such that an effect of extended life can be expected for the hole transport layer 16 according to at least one embodiment of the present disclosure.

As a material for forming the light emitting layer 17, an organic material that is a known fluorescent substance can be used. Example include a fluorescent substance such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, and acridine compound. The light emitting material is not limited to a fluorescent substance, and may be known phosphorescent substance such as a phosphorescent metal complex such as tris(2-phenylpyridine) iridium Further, the light emitting layer 17 may be formed by doping a host material having a high carrier mobility with a light emitting material. Here, high carrier mobility means high electron mobility and/or high hole mobility. As the host material, for example, an amine compound, a condensed polycyclic aromatic compound, or a heterocyclic compound can be used. As an amine compound, for example, a monoamine derivative, a diamine derivative, a triamine derivative, or a tetraamine derivative can be used. As a condensed polycyclic aromatic compound, for example, an anthracene derivative, a naphthalene derivative, a naphthacene derivative, a phenanthrene derivative, a chrysene derivative, a fluoranthene derivative, a triphenylene derivative, a pentacene derivative, and a perylene derivative can be used. As a heterocyclic compound, for example, a carbazole derivative, a furan derivative, a pyridine derivative, a pyrimidine derivative, a triazine derivative, an imidazole derivative, a pyrazole derivative, a triazole derivative, an oxazole derivative, an oxadiazole derivative, a pyrrole derivative, an indole derivative, an azaindole derivative, an azacarbazole derivative, a pyrazoline derivative, a pyrazolone derivative, or a phthalocyanine derivative can be used. In a case where the light emitting layer is formed from a fluorescent material and a host material, according to at least one embodiment, concentration of the fluorescent material is 1 wt % or more. Further, according to at least one embodiment, concentration of the fluorescent material is 10 wt % or less. Further, according to at least one embodiment, concentration of the fluorescent material is 30 wt % or less.

<First Electron Transport Layer>

The first electron transport layer 18 is formed on the light emitting layer 17, and has a function of transporting electrons injected from the second electron transport layer 19 to the light emitting layer 17. The first electron transport layer 18 is, for example, a vapor deposition film and is made of an organic material having an electron transport property. An example of an organic material used for the first electron injection layer 18 is a π electron low molecular weight organic material such as an oxadiazole derivative (OXD), a triazole derivative (TAZ), a phenanthroline derivative (BCP, Bphen), or the like.

<Second Electron Transport Layer>

The second electron transport layer 19 is formed on the first electron transport layer 18, and is made of an organic material that has an electron transport property doped with a metal material that improves an electron injection property. Here, doping refers to substantially even distribution of metal atoms or metal ions of the metal material in the organic material, specifically forming a single phase containing the organic material and a trace amount of the metal material. It is preferable that no other phase exists, in particular a phase consisting only of the metal material such as a metal piece or metal film, or a phase containing the metal material as a main component. Further, in a single phase containing the organic material and a trace amount of the metal material, concentration of metal atoms or metal ions is preferably uniform, and the metal atoms or metal ions are preferably not aggregated. The metal material is preferably selected from alkali metals, alkaline earth metals, or rare earth metals. Further, doping amount of the metal material in the second electron transport layer 18 is preferably from 3 wt % to 60 wt %. The metal dopant is not limited to a simple metal, and may be a compound such as a fluoride (for example, NaF) or a quinolinium complex (for example, $Alq_3$, Liq), or the like. Examples of the metal dopant include lithium (Li), sodium (Na), potassium (K), rubidium (Rb), cesium (Cs), francium (Fr), which correspond to alkali metals, calcium (Ca), strontium (Sr), barium (Ba), radium (Ra), which correspond to alkaline earth metals, and yttrium (Y), samarium (Sm), europium (Eu), ytterbium (Yb), and the like, which correspond to rare earth metals.

Examples of organic materials used for electron transportability are π electron low molecular weight organic materials such as an oxadiazole derivative (OXD), a triazole derivative (TAZ), a phenanthroline derivative (BCP, Bphen), or the like.

A single electron transport layer may be formed instead of the first electron transport layer 18 and the second electron transport layer 19.

<Optical Adjustment Layer>

The optical adjustment layer 20 is made of a somewhat light transmissive, electrically conductive material, and is formed on the second electron transport layer 19.

A light reflective interface between the counter electrode 21 and the optical adjustment layer 20 when paired with a light reflective interface between the pixel electrode 13 and the hole injection layer 15 forms an optical cavity structure. Accordingly, when light emitted from the light emitting layer 17 is incident on the counter electrode 21 from the optical adjustment layer 20, some light needs to be reflected to the optical adjustment layer 20. Accordingly, it is preferable that the counter electrode 21 and the optical adjustment layer 20 have different refractive indices. For example, when the counter electrode 21 is a metal thin film, the optical adjustment layer 20 is preferably an oxide conductor such as ITO or IZO. Further, for example, when the counter electrode 21 is an oxide conductor such as ITO or IZO, the optical adjustment layer 20 is preferably a metal thin film such as Ag or Al. According to at least one embodiment, material of the optical adjustment layer 20 is IZO, and has a film thickness of 104 nm.

<Counter Electrode>

The counter electrode 21 is made of a somewhat light transmissive, electrically conductive material, and is formed on the optical adjustment layer 20. According to at least one embodiment, the counter electrode 21 functions as a cathode.

As mentioned above, the light reflective interface between the counter electrode 21 and the optical adjustment layer 20 when paired with the light reflective interface between the pixel electrode 13 and the hole injection layer 15 forms an optical cavity structure. Accordingly, it is preferable that the counter electrode 21 and the optical adjustment layer 20 have different refractive indices. According to at least one embodiment, the counter electrode 21 is a metal thin film. In order to ensure partial light transmission, film thickness of the metal layer is approximately from 1 nm to 50 nm.

Examples of material of the counter electrode 21 include Ag, silver alloy that has Ag as a main component, Al, and aluminum alloy that has Al as a main component. Examples of Ag alloy include magnesium silver alloy (MgAg) and indium silver alloy. Example of Al alloy include magnesium aluminum alloy (MgAl) and lithium aluminum alloy (LiAl). Examples of other alloys include lithium magnesium alloy and lithium indium alloy. According to at least one embodiment, the counter electrode 21 is an Ag thin film.

Further, the counter electrode 21 may be composed of a single metal layer or a single metal oxide layer, or may have a laminated structure in which the metal oxide layer is laminated on the metal layer, or the metal layer laminated on the metal oxide layer.

When the pixel electrode 13 is a light transmissive electrode, the counter electrode 21 may be a light reflective electrode. In this case, the counter electrode 21 includes a metal layer made of a light reflective metal material. Specific examples of metal material having light reflectivity include silver, aluminum, aluminum alloy molybdenum, APC, ARA, MoCr, MoW, NiCr, and the like.

<Other Elements>

The organic EL element 1 is on a substrate 11. The substrate 11 is made of a base 111 that is an insulating material. Alternatively, a wiring layer 112 may be formed on the base 111 that is an insulating material. The base 111, for example, can be a glass substrate, a quartz substrate, a silicon substrate, a plastic substrate, or the like. As a plastic material, either a thermoplastic resin or a thermosetting resin may be used. For example, polyethylene, polypropylene, polyamide, polyimide (PI), polycarbonate, acrylic resin, polyethylene terephthalate (PET), polybutylene terephthalate, polyacetal, other fluororesins, various thermoplastic elastomers such as styrene, polyolefin, polyvinyl chloride, polyurethane, fluororubber, and chlorinated polyethylene based elastomers, epoxy resin, unsaturated polyester, silicone resin, polyurethane, and the like, or copolymers, blends, polymer alloys, or the like that are mainly composed of these, or a laminate of one or more of these can be used. As material of the wiring layer 112, examples include metal materials such as molybdenum sulfide, copper, zinc, aluminum, stainless steel, magnesium, iron, nickel, gold, and silver, inorganic semiconductor materials such as gallium nitride, gallium arsenide, and the like, organic semiconductor materials such as anthracene, rubrene, polyparaphenylene vinylene, and the like, and a thin film transistor (TFT) layer formed by using these in combination may be used.

Further, although not shown, an interlayer insulating layer 12 is formed on the substrate 11. The interlayer insulating layer 12 is made of a resin material and is for planarizing steps on an upper surface of the TFT layer 112. Examples of the resin material include positive photosensitive material. Further, as such a photosensitive material, an acrylic resin, a polyimide resin, a siloxane resin, or a phenol resin can be used. Further, a contact hole is formed in the interlayer insulating layer 12 for each pixel.

When the organic EL display panel 100 is a bottom emission panel, the base 111 and the interlayer insulating layer 12 need to be formed of a light transmissive material. Further, when the TFT layer 112 is present, at least a part of each area below the pixel electrodes 13 in the TFT layer 112 needs to be light transmissive.

Further, a sealing layer 22 is formed on the organic EL element 1. The sealing layer 22 has a function of suppressing exposure to moisture and air for organic layers such as the hole injection layer 15, the hole transport layer 16, the light emitting layer 17, the first electron transport layer 18, the second electron transport layer 19, and the like, and is formed using a light transmissive material such as silicon nitride (SiN), silicon oxynitride (SiON), or the like. Further, a sealing resin layer made of a resin material such as an acrylic resin or silicone resin may be provided on a layer formed using a material such as silicon nitride (SiN) or silicon oxynitride (SiON).

When the organic EL display panel 100 is a top emission panel, the sealing layer 22 needs to be made of a light transmissive material. Although not shown in FIG. 1, a color filter or an upper substrate may be bonded onto the sealing layer 22 via a sealing resin. By bonding the upper substrate, the hole injection layer 15, the hole transport layer 16, the light emitting layer 17, the first electron transport layer 18, and the second electron transport layer 19 can be protected from moisture, air, and the like.

2. Relationship Between Hole Injectability and Drive Voltage

The organic EL element according to an aspect of the present disclosure is characterized in that deterioration of a functional layer due to excitons can be suppressed. Hereinafter, with the organic EL element 1 that suppresses deterioration of the hole transport layer 16 caused by excitons as an aspect of the present disclosure, relationships between a hole injection barrier and hole density, and drive voltage, are illustrated in comparison with a reference example. Electrical properties of embodiments and reference examples illustrated under heading [2.3] below and subsequently were calculated using a device model having the energy band structure illustrated under heading [2.1] below in a device simulation technology computer-aided design (TCAD) manufactured by Silvaco.

2.1 Energy Band Structure

Figure 2:
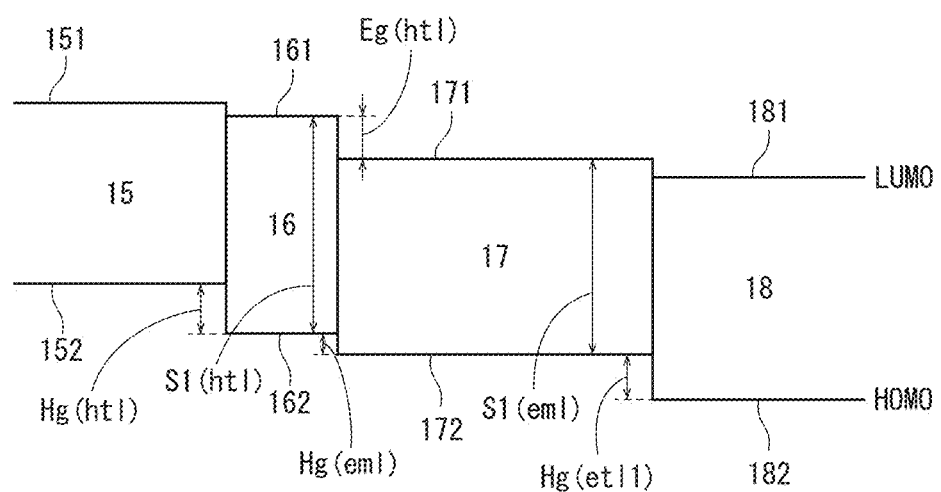
FIG. 2 is a simplified schematic diagram illustrating a band diagram of a hole injection layer, a hole transport layer, a light emitting layer, and a first electron transport layer according to at least one embodiment.

FIG. 2 is a band diagram illustrating an energy band structure of the organic EL element 1 according to at least one embodiment. For the sake of brevity, energy levels of organic materials of each layer may be abbreviated as "layer energy level" below. For layers made of multiple types of materials, energy level of a representative organic material responsible for transporting electrons and/or holes is referred to as the "layer energy level".

In FIG. 2, LUMO energy levels (hereinafter also referred to as "LUMO levels") and HOMO energy levels (hereinafter also referred to as "HOMO levels") of the hole injection layer 15, the hole transport layer 16, the light emitting layer 17, and the first electron transport layer 18 are illustrated, and other layers are omitted. Although electron vacuum level is not shown in FIG. 2, for both the LUMO level and the HOMO level, the closer to the lower edge of the band diagram, the greater the difference from the electron vacuum level, and the lower the energy level.

According to the embodiment, an energy barrier for injecting electrons from the first electron transport layer 18 into the light emitting layer 17 is defined by a difference between a LUMO level 171 of the light emitting layer 17 and a LUMO level 181 of the first electron transport layer 18. An energy barrier Eg(htl) for injecting electrons from the light emitting layer 17 to the hole transport layer 16 is defined by a difference between a LUMO level 161 of the hole transport layer 16 and the LUMO level 171 of the light emitting layer 17.

An energy barrier Hg(htl) for injecting holes from the hole injection layer 15 into the hole transport layer 16 is defined by a difference between a HOMO level 152 of the hole injection layer 15 and a HOMO level 162 of the hole transport layer 16. According to at least one embodiment, the energy barrier Hg(htl) preferably satisfies the following (Expression 1).

$$Hg(htl) \geq 0.2 \text{ eV} \hspace{3cm} \text{(Expression 1)}$$

According to the embodiment, Hg(htl) is 0.3 eV.

Further, an energy barrier Hg(eml) for injecting holes from the hole transport layer 16 into the light emitting layer 17 is defined by a difference between the HOMO level 162 of the hole transport layer 16 and a HOMO level 172 of the light emitting layer 17. Further, an energy barrier Hg(etl1) for injecting holes from the light emitting layer 17 into the electron transport layer 18 is defined by a difference between the HOMO level 172 of the light emitting layer 17 and a HOMO level 182 of the first electron transport layer 18.

According to the reference example, Hg(htl) is set to 0 eV, while other electron injection barriers, hole injection barriers, and singlet exciton energy S1, which is a difference between LUMO level and HOMO level, are the same.

2.2 Expected Effects from Design

Figure 3A:
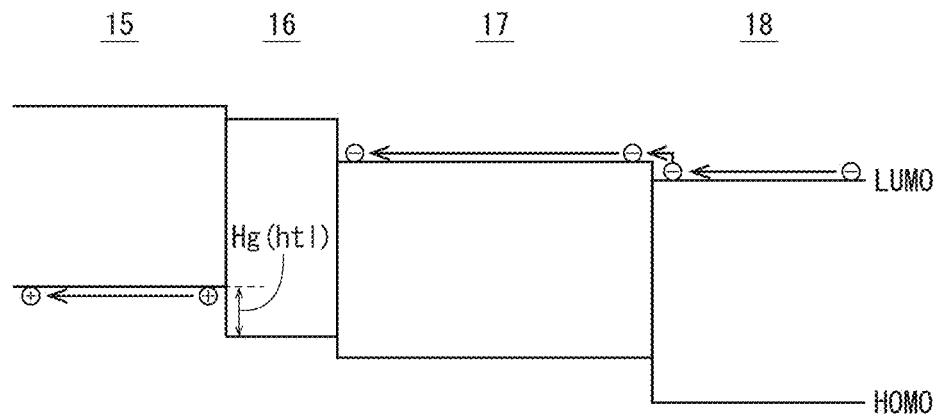
FIG. 3A, 3B, 3C are simplified schematic diagrams illustrating band diagrams and distributions of electrons, holes, and excitons for a hole injection layer, a hole transport layer, a light emitting layer, and a first electron transport layer according to at least one embodiment and reference example.
Figure 3B:
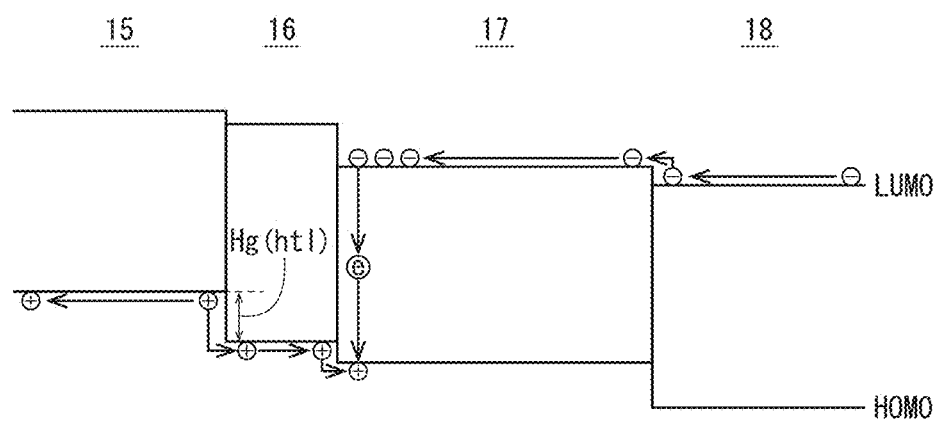
Figure 3C:
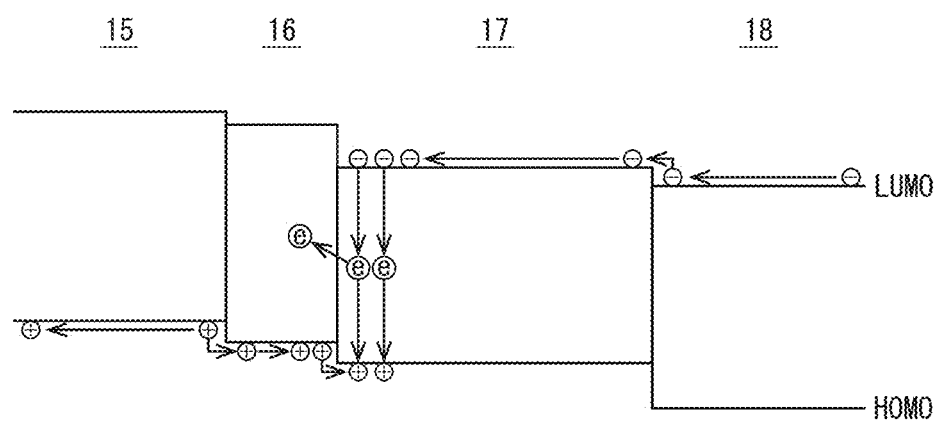

FIG. 3A, 3B, 3C are band diagrams of the hole injection layer 15, the hole transport layer 16, the light emitting layer 17, and the first electron transport layer 18 and simple schematic diagrams illustrating electron and hole recombination, pertaining to an embodiment and a reference example.

According to an organic EL element pertaining to the embodiment, as illustrated in the schematic diagram of FIG. 3A, some electrons injected into a cathode side of the light emitting layer 17 are consumed by recombination, and a remainder move in the light emitting layer 17 to the vicinity of an interface between the light emitting layer 17 and the hole transport layer 16. On the other hand, as illustrated in FIG. 3B, the hole injection barrier Hg(htl) from the hole injection layer 15 to the hole transport layer 16 is as large as 0.2 eV or more, and therefore hole density in the hole transport layer 16 is small. Further, holes in the hole transport layer 16 move to the vicinity of the interface with the light emitting layer 17, and are then injected into the light emitting layer 17 through the hole injection barrier Hg(eml), where some are consumed by recombination, and a remainder move in the light emitting layer 17 to the vicinity of an interface between the light emitting layer 17 and the first electron transport layer 18. Accordingly, hole density in the hole transport layer 16 can be reduced, and deterioration of hole transport material caused by interaction between holes and excitons can be suppressed.

In contrast, FIG. 3C is a schematic diagram of a case in which the hole injection barrier Hg(htl) from the hole injection layer 15 to the hole transport layer 16 is less than 0.2 eV. In this case also, some electrons injected into the cathode side of the light emitting layer 17 are consumed by recombination, and a remainder move in the light emitting layer 17 to the vicinity of the interface between the light emitting layer 17 and the hole transport layer 16. On the other hand, the hole injection barrier Hg(htl) from the hole injection layer 15 to the hole transport layer 16 is less than 0.2 eV, and therefore hole density in the hole transport layer 16 becomes large. Further, holes in the hole transport layer 16 move to the vicinity of the interface with the light emitting layer 17, and are then injected into the light emitting layer 17 through the hole injection barrier Hg(eml), where some are consumed by recombination, and a remainder move in the light emitting layer 17 to the vicinity of an interface between the light emitting layer 17 and the first electron transport layer 18. Accordingly, hole density in the hole transport layer 16 is high, and therefore excitons are likely to be generated in the hole transport layer 16. Further, many excitons are present in the light emitting layer 17 near the interface between the light emitting layer 17 and the hole transport layer 16, and therefore exciton energy is transferred from light emitting material in the light emitting layer 17 to hole transport material in the hole transport layer 16, and this also tends to increase excitons in the hole transport layer 16. Because of this, both hole density and exciton density become high in the hole transport layer 16. Therefore, as disclosed in "Operational degradation of organic light-emitting diodes: Mechanism and identification of chemical products", D. Y. Kondakov, et al., JOURNAL OF APPLIED PHYSICS 101, 024512 (2007), and "Intrinsic luminance loss in phosphorescent small-molecule organic light emitting devices due to bimolecular annihilation reactions", N. C. Giebink, et al., JOURNAL OF APPLIED PHYSICS 103, 044509 (2008), a phenomenon can occur of energy of excitons in the hole transport material in the hole transport layer 16 moving to polarons of hole transport material, which are holes in the hole transport layer 16. Due to this phenomenon, some of the chemical bonds in polarons of the hole transport material in a high energy state may be released, and a dissociation product produced. Dissociation product is generated at a site where the hole transport material was present before dissociation, and therefore loss of hole transport material due to dissociation not only reduces a hole transport property of the hole transport layer 16, but can also reduce hole transportability of the hole transport layer 16 because of the dissociation product trapping holes. Further, dissociation product is generated in the hole transport layer 16 near the interface between the hole transport layer 16 and the light emitting layer 17, and therefore exciton energy in the light emitting layer 17 is transferred to the dissociation product in the hole transport layer 16, and since this can also be a quenching site that causes non-emission deactivation, this may also bring about a decrease in quantum efficiency of the organic EL element 1. Due to these factors, when the hole injection barrier Hg(htl) from the hole injection layer 15 to the hole transport layer 16 is set to less than 0.2 eV, hole transportability of the hole transport layer 16 deterioration, quantum efficiency of the organic EL element 1 decrease, drive voltage of the organic EL element 1 increase, and a resulting decrease in life are made more likely to occur.

2.3 Hole Density and Exciton Density

The following describes hole density and exciton density in an organic EL element according to at least one embodiment by comparing simulation results of an embodiment and a reference example.

Figure 4A:
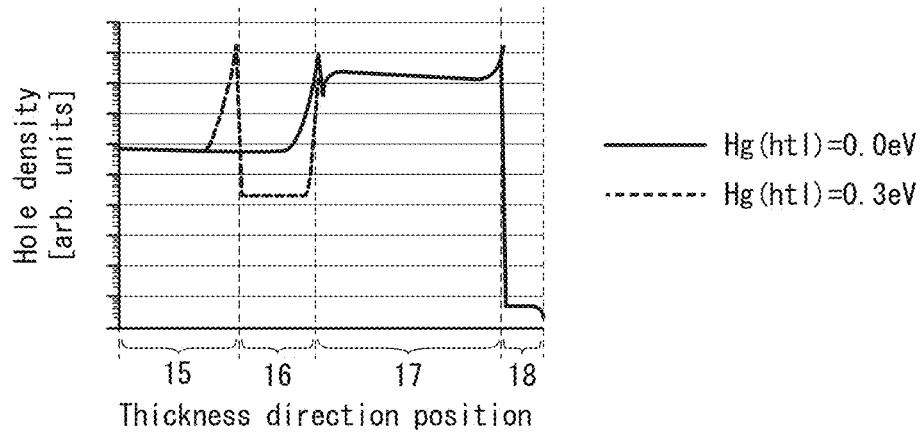
FIG. 4A is a graph illustrating distribution of hole density in a film thickness direction when a voltage is applied to have the same current density in an embodiment and a reference example.

FIG. 4A is a graph illustrating distribution of hole density in a film thickness direction when a voltage is applied to have the same current density in an embodiment and a reference example. FIG. 4A shows a dashed line of simulation results of an embodiment where Hg(htl)=0.3 eV, and a solid line of simulation results of a reference example where Hg(htl)=0.0 eV but other conditions are the same. As illustrated in FIG. 4A, according to the reference example, the hole injection barrier Hg(htl) between the hole injection layer 15 and the hole transport layer 16 is small, and therefore holes are injection from the hole injection layer 15 to the hole transport layer 16 without delay, and there is almost no difference in hole density between the hole injection layer 15 and the hole transport layer 16. In contrast, according to the embodiment, the hole injection barrier Hg(htl) between the hole injection layer 15 and the hole transport layer 16 is as large as 0.3 eV, and therefore hole injection from the hole injection layer 15 to the hole transport layer 16 is suppressed, hole density in the hole injection layer 15 in the vicinity of the hole transport layer 16 increases, and density in the hole transport layer 16 decreases. That is, according to the reference example, holes are almost evenly present from the hole injection layer 15 to the hole transport layer 16, whereas according to the embodiment, holes are unevenly distributed in the hole injection layer 15 and hole density in the hole transport layer 16 decreases. On the other hand, hole density in the light emitting layer 17 is substantially the same regardless of the value of the hole injection barrier Hg(htl). The reason for this is that when hole density of the hole transport layer 16 decreases, electrical resistance of the hole transport layer 16 increases, a larger voltage is applied to the hole transport layer 16, and a larger electric field is generated in the hole transport layer 16. Therefore, hole mobility inside the hole transport layer 16 becomes larger due to this larger electric field, and even with lowered hole density, hole current does not decrease in proportion to the decrease in hole density, such that feedback occurs bringing the hole current closer to a case where the hole injection barrier is small. Therefore, if current flowing through organic EL elements is the same, it is considered that amounts of holes injected from anodes (pixel electrode 13) into the light emitting layers 17 are the same. That is, according to the embodiment, when compared to the reference example, if current flowing through the entire organic EL element is the same, hole density in the hole transport layer 16 can be reduced without lowering hole density in the light emitting layer 17.

Figure 4B:
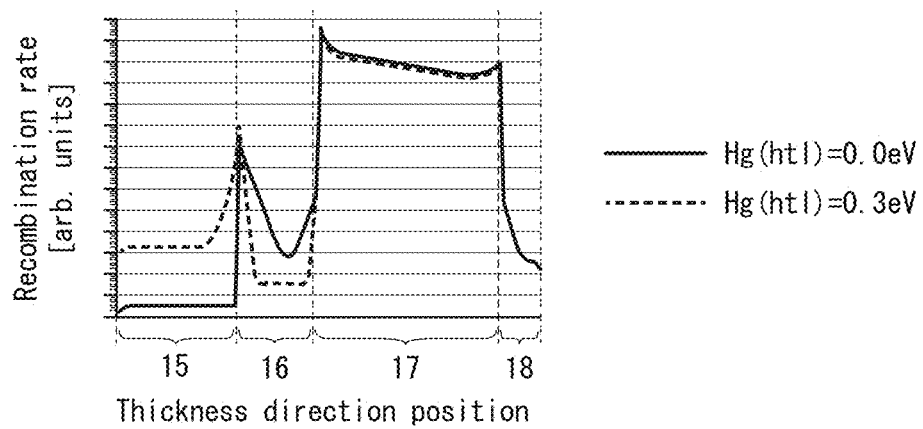
FIG. 4B is a graph illustrating distribution of recombination rate in a film thickness direction when a voltage is applied to have the same current density in an embodiment and a reference example.

FIG. 4B is a graph illustrating distribution of recombination rate in a film thickness direction when a voltage is applied to have the same current density in an embodiment and a reference example. FIG. 4B shows a dashed line of simulation results of an embodiment where Hg(htl)=0.3 eV, and a solid line of simulation results of a reference example where Hg(htl)=0.0 eV but other conditions are the same. As illustrated in FIG. 4B, recombination rate in the hole transport layer 16 is lower in the embodiment than in the reference example. A reason for this, as described above, is that hole density in the hole transport layer 16 is lower in the embodiment than in the reference example. On the other hand, as described above, recombination rate in the light emitting layer 17 is almost the same between the embodiment and the reference example. A reason for this, as described above, is that there is no difference in hole density in the light emitting layer 17 between the embodiment and the reference example.

Figure 4C:
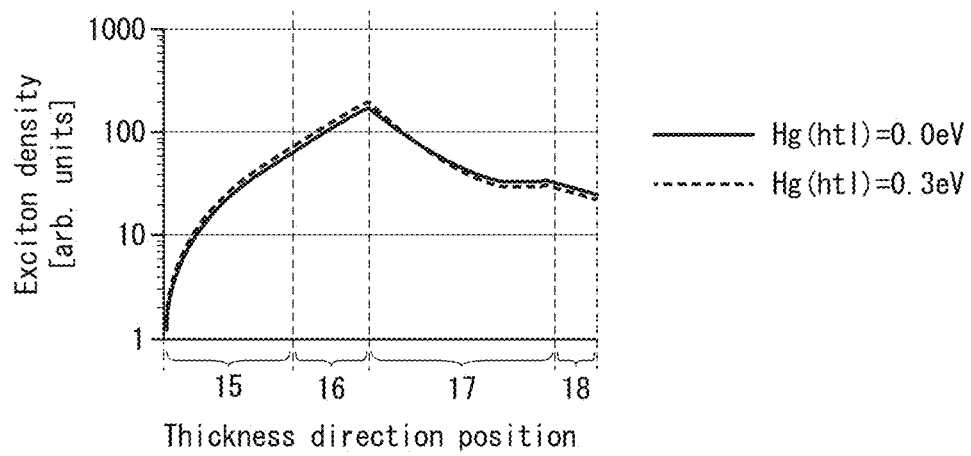
FIG. 4C is a graph illustrating distribution of excitons in a film thickness direction when a voltage is applied to have the same current density in an embodiment and a reference example.

FIG. 4C is a graph illustrating distribution of excitons in a film thickness direction when a voltage is applied to have the same current density in an embodiment and a reference example. FIG. 4C shows a dashed line of simulation results of an embodiment where Hg(htl)=0.3 eV, and a solid line of simulation results of a reference example where Hg(htl)=0.0 eV but other conditions are the same. As illustrated in FIG. 4C, exciton densities in the light emitting layer 17 are almost the same between the embodiment and the reference example. A reason for this, as described above, is that there is no difference in hole density or recombination rate in the light emitting layer 17 between the embodiment and the reference example. Further, in the hole transport layer 16 also, there is almost no difference in exciton density between the embodiment and the reference example. A reason for this is that, according to the embodiment, although the hole density and the recombination rate are low in the hole transport layer 16 and the amount of excitons generated is small, many excitons are generated in the light emitting layer 17 in the vicinity of the hole transport layer 16, and therefore exciton density does not decrease even in the hole transport layer 16, because of energy transfer from the light emitting layer 17 to the hole transport layer 16. However, according to the embodiment, in comparison to the reference example, exciton density in the hole transport layer 16 is not large, and hole density is low, and therefore deactivation reaction due to bonding between excitons and holes is suppressed, and deterioration of material of the hole transport layer 16 can be suppressed.

2.4 Voltage-Current Properties

The following describes effects of Hg(htl) and film thickness of the hole transport layer 16 on voltage-current properties of an organic EL element according to at least one embodiment.

Figure 5A:
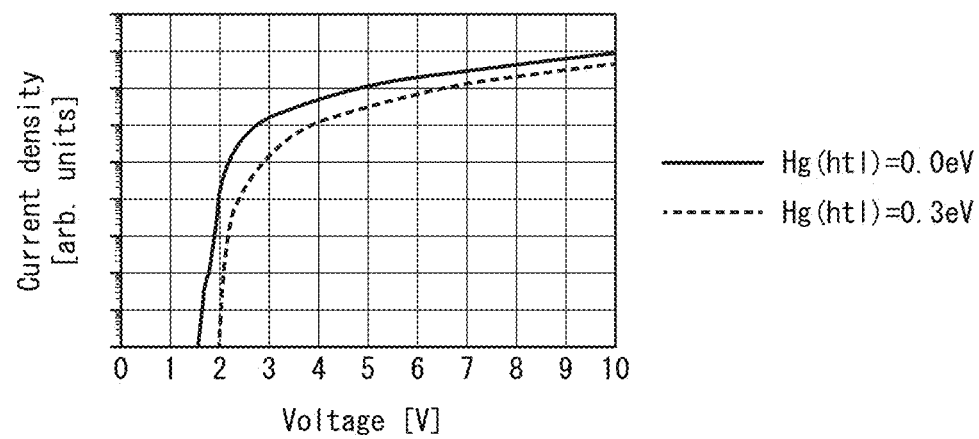
FIG. 5A is a graph illustrating a relationship between applied voltage and current in an embodiment and a reference example.

FIG. 5A is a graph illustrating a relationship between applied voltage and current in the embodiment and a reference example. FIG. 5A shows a dashed line of simulation results of an embodiment where Hg(htl)=0.3 eV, and a solid line of simulation results of a reference example where Hg(htl)=0.0 eV but other conditions are the same. As illustrated in FIG. 5A, when the same amount of current is passed through, the embodiment requires a higher voltage than the reference example. A reason for this that impedance of the hole transport layer 16 increases because the hole injection barrier Hg(htl) from the hole injection layer 15 to the hole transport layer 16 is large. That is, when conditions other than a value of the hole injection barrier Hg(htl) from the hole injection layer 15 to the hole transport layer 16 are the same, the embodiment requires a higher drive voltage than the reference example.

Figure 5B:
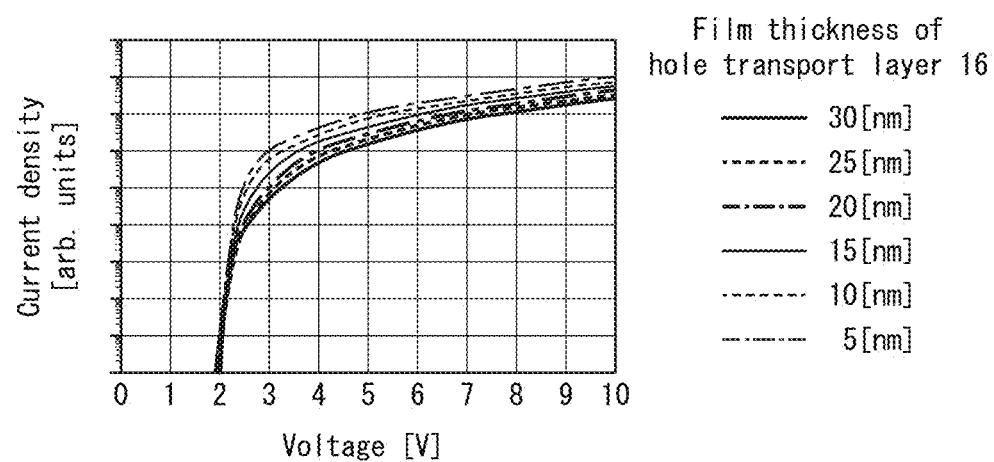
FIG. 5B is a graph illustrating a relationship between applied voltage and current for each film thickness of a hole transport layer 16 of an embodiment and organic EL elements that are the same as the embodiment except for film thickness of the hole transport layer 16.

On the other hand, FIG. 5B is a graph illustrating a relationship between applied voltage and current for each film thickness of a hole transport layer 16 of the embodiment and organic EL elements that are the same as the embodiment except for film thickness of the hole transport layer 16. As illustrated in FIG. 5B, the smaller the film thickness of the hole transport layer 16, the smaller the applied voltage when trying to pass the same amount of current. A reason for this that impedance of the hole transport layer 16 becomes smaller as film thickness of the hole transport layer 16 becomes smaller. That is, the smaller the film thickness of the hole transport layer 16, the lower the drive voltage of the organic EL element.

Figure 6A:
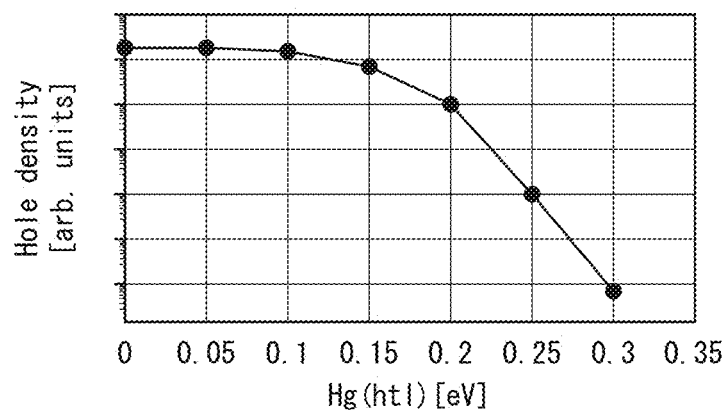
FIG. 6A is a graph illustrating Hg(htl) value and hole density in the hole transport layer 16.

2.5 Optimal Values for Hole Injection Barrier and Hole Transport Layer Film Thickness FIG. 6A is a graph illustrating Hg(htl) value and hole density in the hole transport layer 16. As illustrated in FIG. 6A, hole density in the hole transport layer 16 hardly changes when Hg(htl) is 0.15 eV or less, and decreases remarkably when Hg(htl) is 0.2 eV or less. Accordingly, in order to reduce hole density in the hole transport layer 16, Hg(htl) is preferably 0.2 eV or more.

Figure 6B:
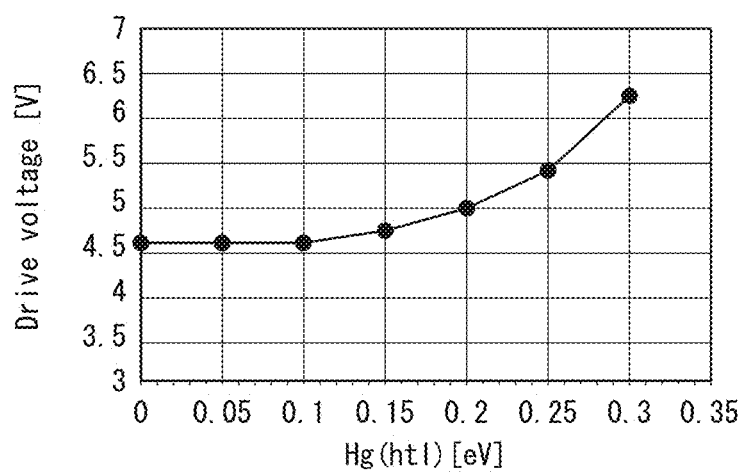
FIG. 6B is a graph illustrating a relationship between Hg(htl) value and drive voltage of an organic EL element.

On the other hand, FIG. 6B is a graph illustrating a relationship between Hg(htl) value and drive voltage of an organic EL element. Here, drive voltage refers to voltage required to set current value to a defined value. As illustrated in FIG. 6B, drive voltage hardly changes when Hg(htl) is 0.15 eV or less, and increases remarkably when Hg(htl) is 0.2 eV or more. Accordingly, if an influence of the increase in drive voltage due to increase in Hg(htl) can be offset by the decrease in drive voltage due to reduction in film thickness of the hole transport layer 16, life of the hole transport layer 16 can be extended without increasing drive voltage of the entire organic EL element.

Figure 7:
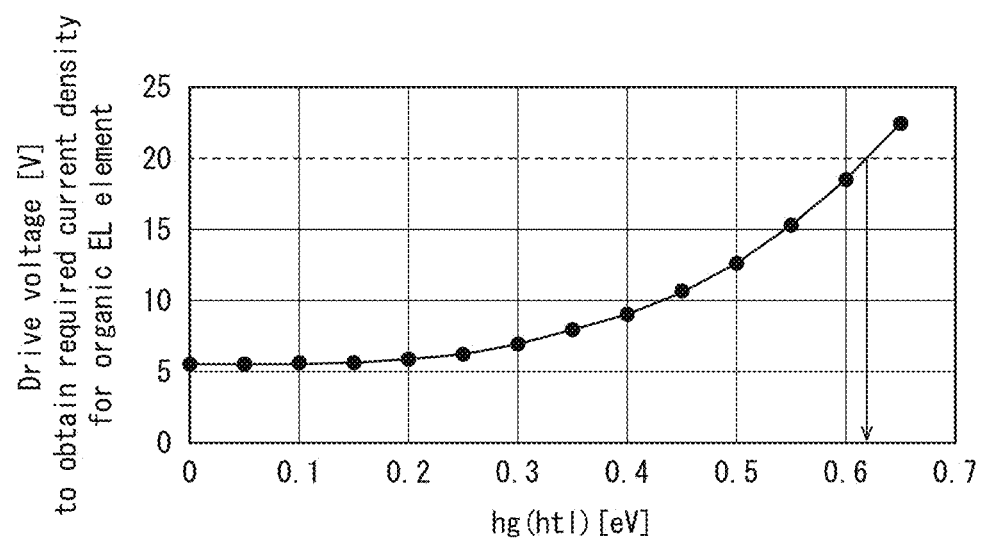
FIG. 7 is a graph illustrating a relationship between Hg(htl) value and drive voltage of an organic EL element for obtaining current density required for the organic EL element.

FIG. 7 is a graph illustrating a relationship between Hg(htl) value and drive voltage of an organic EL element for obtaining a current density required for an organic EL element. When film thickness of the hole transport layer 16 is 15 nm, properties are calculated with different Hg(htl) values, and required current density is 20 mA/cm$^2$, a relationship between drive voltage and Hg(htl) value to obtain the required current density is shown in FIG. 7.

Here, the current density of 20 mA/cm$^2$ required for an organic EL element is calculated as follows. That is, the organic EL element is required to have a high luminance of about 1000 cd/m$^2$ as a white peak luminance. Even in monochromatic light emission, a luminance of about several hundred cd/m$^2$ is required. For example, a blue light emitting element having a lowest energy efficiency requires a luminance from 300 cd/m$^2$ to 400 cd/m$^2$. Considering efficiency of a blue light emitting element (2 cd/A to 10 cd/A, here 2 cd/m$^2$), a current density of 20 mA/cm$^2$ is required to obtain a luminance of 400 cd/m$^2$.

On the other hand, considering a distance between anode and cathode electrodes of the organic EL element (100 nm to 200 nm, here 200 nm), an applied voltage corresponding to a dielectric breakdown electric field strength of $1 \times 10^6$ V/cm$^2$ of organic semiconductor material constituting the organic EL element is 20 V. From FIG. 7, it can be seen that applied voltage is 20 V when Hg(htl) value is 0.62 eV, and when Hg(htl) is 0.6 eV a drive voltage exceeding 20 V is applied and dielectric breakdown is likely to occur.

From the above, it can be seen that approximately 0.6 eV is an upper limit for Hg(htl) in order to obtain a current density of 20 mA/cm$^2$ required for an organic EL device at a drive voltage of 20 V or less that satisfies a dielectric breakdown electric field strength of the organic semiconductor material.

As a result, in the organic EL element 1, by setting the Hg(htl) value to 0.6 eV or less, current density required for an organic EL element is secured, and dielectric breakdown electric field strength of organic semiconductor material of the hole transport layer 16 can be satisfied.

Figure 8A:
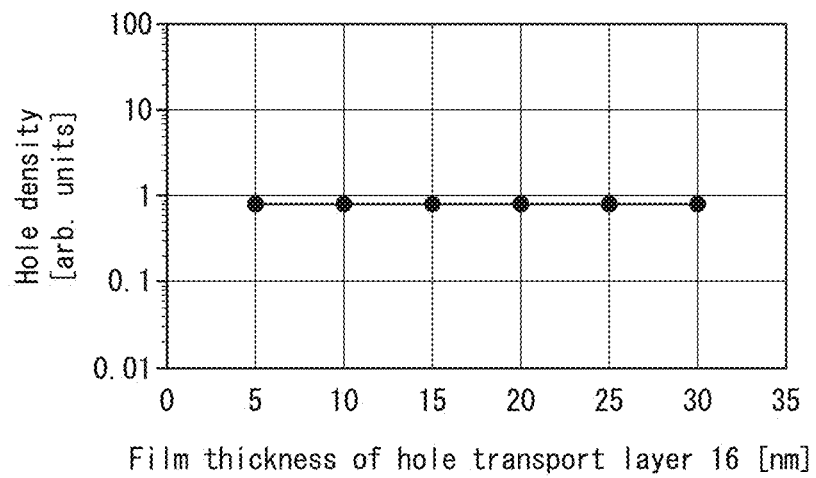
FIG. 8A is a graph illustrating a relationship between film thickness of the hole transport layer 16 and hole density in the hole transport layer 16.

Here, it is confirmed that hole density in the hole transport layer 16 does not increase due to a reduction in film thickness of the hole transport layer 16. FIG. 8A is a graph illustrating a relationship between film thickness of the hole transport layer 16 and hole density in the hole transport layer 16. Here, hole density in the hole transport layer 16 is a value in the hole transport layer 16 on an anode (pixel electrode 13) side, 1 nm from the interface with the light emitting layer 17. As illustrated in FIG. 8A, hole density in the hole transport layer 16 does not substantially depend on film thickness of the hole transport layer 16. That is, even if film thickness of the hole transport layer 16 is reduced, hole density in the hole transport layer 16 does not increases, and therefore only the drive voltage is reduced without changing a degree of deterioration in the hole transport layer 16.

Figure 8B:
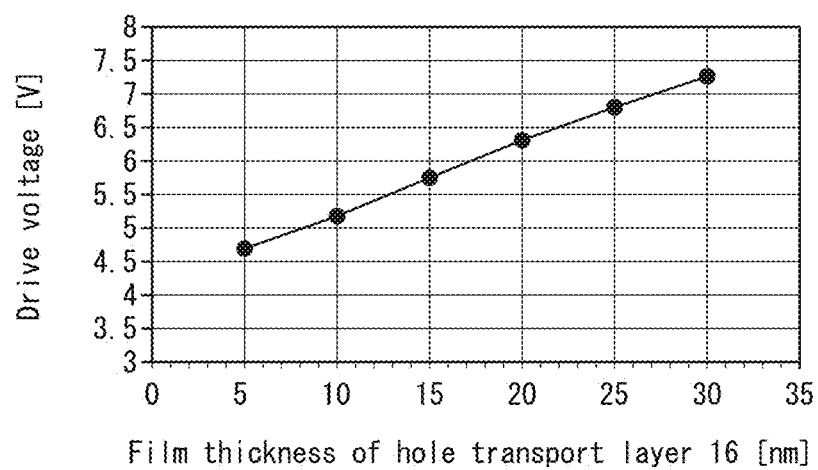
FIG. 8B is a graph illustrating a relationship between film thickness of the hole transport layer 16 and drive voltage.

FIG. 8B is a graph illustrating a relationship between film thickness of the hole transport layer 16 and drive voltage. Here, drive voltage refers to voltage required to set current value to a defined value, as described above. As illustrated in FIG. 8B, the smaller the film thickness of the hole transport layer 16, the smaller the drive voltage. For example, if Hg(htl) is increased from 0.0 eV to 0.2 eV, drive voltage increases by 0.4 V as shown in FIG. 6B, but if film thickness of the hole transport layer 16 is reduced from 20 nm to 15 nm, as shown in FIG. 8B, drive voltage is reduced by 0.4 V, so the increase in drive voltage can be offset. Accordingly, for example, film thickness of the hole transport layer 16 is preferably 15 nm or less.

[3. Effects]

Figure 9A:
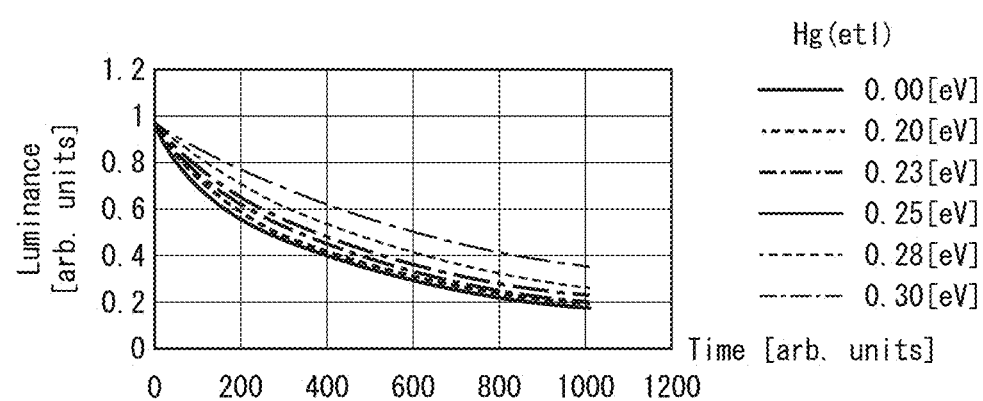
FIG. 9A is a graph illustrating a relationship between operating time and luminance for each hole injection barrier Hg(htl) for an embodiment and organic EL elements that are the same as the embodiment aside from film thickness of the hole transport layer.

FIG. 9A is a graph illustrating a relationship between operating time and luminance for each hole injection barrier Hg(htl) value for an embodiment and organic EL elements that are the same as the embodiment aside from film thickness of the hole transport layer 16. Note that luminance is shown as a relative value where a luminance of 1 indicates a state when usage time is 0. As shown in FIG. 9A, the larger the hole injection barrier Hg(htl), the smaller the degree of decrease in luminance. A reason for this is that hole density of the hole transport layer 16 decreases as the hole injection barrier Hg(htl) increases, as described above, such that deterioration rate of the hole transport layer 16 decreases.

Figure 9B:
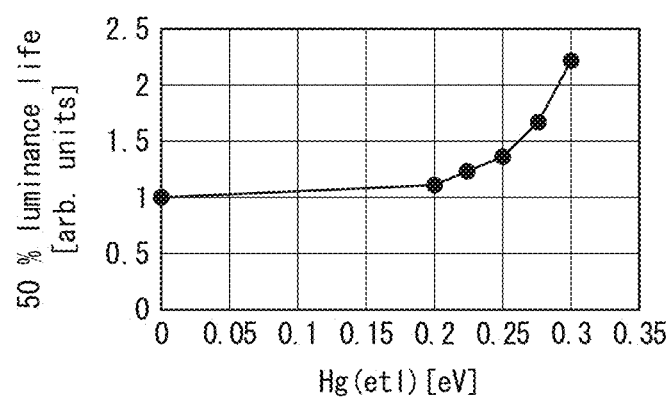
FIG. 9B is a graph illustrating a relationship between hole injection barrier Hg(htl) value and 50% luminance lifetime.

FIG. 9B is a graph showing a relationship between hole injection barrier Hg(htl) value and 50% luminance lifetime. Here, 50% luminance lifetime is a usage time when luminance is 0.5, where a luminance of 1 indicates a state at a usage time 0, indicated as a value relative to a usage time of 1 when Hg(htl)=0.0 eV. As shown in FIG. 9B, as the hole injection barrier Hg(htl) becomes larger, 50% luminance lifetime increases, and in particular when the hole injection barrier Hg(htl) is 0.2 eV or more, 50% luminance lifetime improves remarkably.

4. Review

As described above, an organic EL element according to at least one embodiment has a hole injection barrier Hg(htl) from the hole injection layer 15 to the hole transport layer 16 of 0.2 eV or more. Accordingly, hole density in the hole transport layer 16 can be reduced, and therefore deactivation reactions between holes and excitons can be suppressed, deterioration of a hole transport property of the hole transport layer 16 caused by deactivation reactions can be suppressed, and life of the organic EL element can be extended.

Further, according to the organic EL element pertaining to at least one embodiment, film thickness of the hole transport layer 16 is 15 nm or less. Accordingly, impedance of the hole transport layer 16 can be lowered, and an effect of an increase in impedance of the hole transport layer 16 due to a large value for the hole injection barrier Hg(htl) from the hole injection layer 15 to the hole transport layer 16 can be offset. Accordingly, an increase in drive voltage can be suppressed.

That is, according to the organic EL element pertaining to at least one embodiment, a hole injection property from the first functional layer to the second functional layer is lowered, and therefore hole density in the second functional layer can be lowered. Therefore, in the second functional layer, a deactivation reaction between holes and excitons can be suppressed, and deterioration of the functional layer can be suppressed, and therefore an extension in life of the organic EL element can be expected. Further, by limiting film thickness of the second functional layer, it is possible to suppress an increase in drive voltage even if hole injection property from the first functional layer to the second functional layer is decreased.

5. Organic EL Element Manufacturing Method

A method of manufacturing an organic EL element is described below with reference to the drawings. FIG. 10A to FIG. 13C are schematic cross section diagrams illustrating states in manufacturing an organic EL display panel including organic EL elements. FIG. 14 is a flowchart illustrating the method of manufacturing the organic EL display panel including the organic EL elements.

In the organic EL display panel, the pixel electrodes (lower electrodes) function as anodes of the organic EL elements, and the counter electrode (upper electrode, common electrode) functions as the cathode of the organic EL elements.

(1) Forming Substrate 11

Figure 10A:
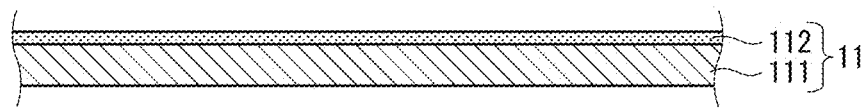
FIG. 10A, 10B, 10C, 10D, 10E are partial cross section diagrams schematically illustrating part of a process of manufacturing an organic EL element according to at least one embodiment, where

First, as illustrated in FIG. 10A, the TFT layer 112 is formed on the base 111 to form the substrate 11 (step S10). The TFT layer 112 can be formed by a known ITT manufacturing method.

Figure 10B:
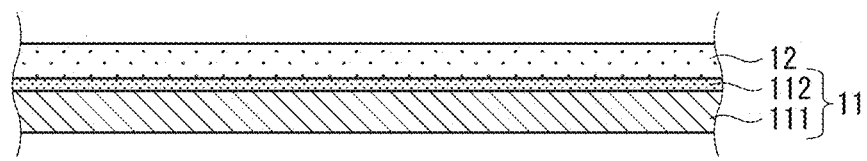

Next, as illustrated in FIG. 10B, the interlayer insulating layer 12 is formed on the substrate 11 (step S20). The interlayer insulating layer 12 can be formed, for example, by a plasma chemical vapor deposition (CVD) method, a sputtering method, or the like.

Next, contact holes are formed in the interlayer insulating layer 12 by performing dry etching at locations above source electrodes of the TFT layer. Contact holes are formed so that surfaces of the source electrodes are exposed at the bottom of the contact holes.

Next, connecting electrode layers are formed along inner walls of the contact holes. A portion of an upper part of each connecting electrode layer is disposed on the interlayer insulating layer 12. In forming the connecting electrode layers, for example, a sputtering method can be used, and after forming a metal film, patterning is performed using a photolithography method and a wet etching method.

(2) Forming Pixel Electrodes 13

Figure 10C:
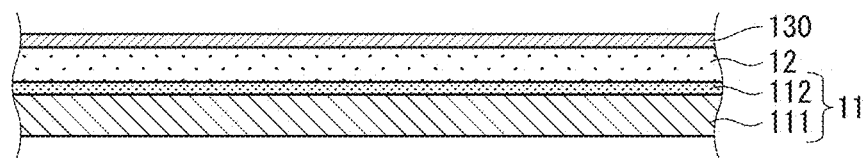

Next, as illustrated in FIG. 10C, a pixel electrode material layer 130 is formed on the interlayer insulating layer 12 (step S31). The pixel electrode material layer 130 can be formed by, for example, a vacuum deposition method, a sputtering method, or the like.

Figure 10D:
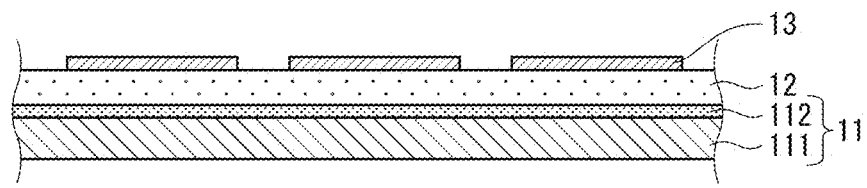

Then, as illustrated in FIG. 10D, the pixel electrode material layer 130 is patterned by etching to form the pixel electrodes 13 partitioned into sub pixels (step S32). The pixel electrodes 13 function as anodes of the organic EL elements.

A method of forming the pixel electrodes 13 is not limited to the above method. For example, a hole injection material layer 150 may be formed on the pixel electrode material layer 130 by a vapor deposition method, and the pixel electrode material layer 130 and the hole injection material layer 150 patterned using the same photoresist to form laminated structures of the pixel electrodes 13 and the hole injection layers 15.

(3) Forming Banks 14

Figure 10E:
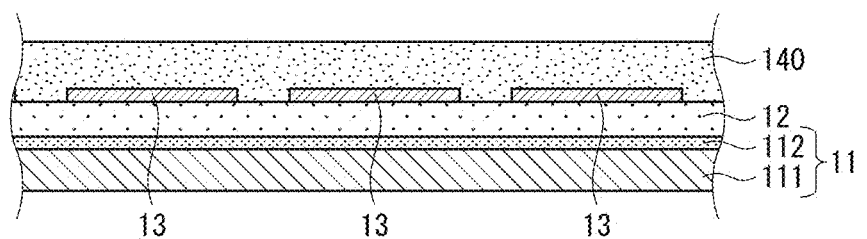

Next, as illustrated in FIG. 10E, bank resin that is a material of the banks 14 is applied on the pixel electrodes 13 and the interlayer insulating layer 12 to form a bank material layer 140. The bank material layer 140 is formed by uniform application using a spin coating method or the like on the pixel electrodes 13 and the interlayer insulating layer 12, applying a solution of a phenol resin that is a bank layer resin dissolved in a solvent (for example, a mixed solvent of ethyl lactate and γ-Butyrolactone (GBL)) (step S41). Then the banks 14 are formed by pattern exposure and development of the bank material layer 140 (FIG. 11A, step S42), and the banks 14 are baked. As a result, apertures 14a are defined, which are areas in which the light emitting layers 17 are formed. The banks 14 are baked, for example, at a temperature from 150° C. to 210° C. for 60 minutes.

Further, in forming the banks 14, surfaces of the banks 14 may be further surface treated with a defined alkaline solution, water, an organic solvent, or the like, or may be subjected to plasma treatment. This is done for the purpose of adjusting contact angle of the banks 14 with respect to ink (solution) applied to the apertures 14a, or for the purpose of imparting water repellency to the surfaces.

(4) Forming Hole Injection Layers 15

Figure 11A:
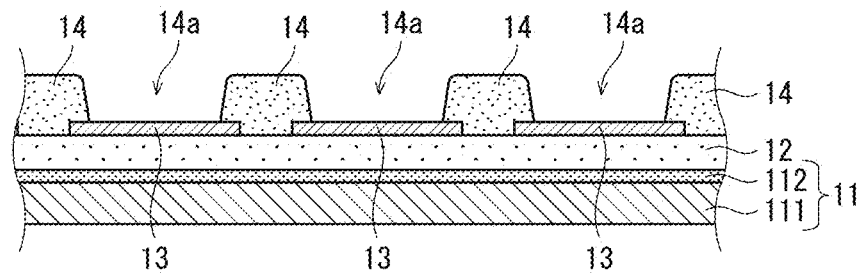
FIG. 11A, 11B, 11C are partial cross section diagrams schematically illustrating part of the process of manufacturing the organic EL element according to at least one embodiment, where
Figure 11B:
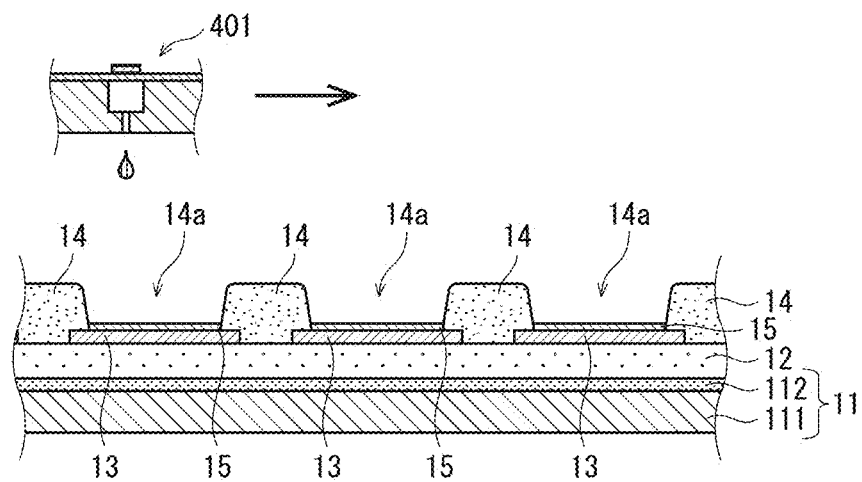

Next, as illustrated in FIG. 11B, ink containing constituent material of the hole injection layers 15 is ejected from nozzles of an inkjet head 401 into the apertures 14a defined by the banks 14 to be applied onto the pixel electrodes 13 in the apertures 14a, then baked (dried) to form the hole injection layers 15 (step S50).

(5) Forming Hole Transport Layers 16

Figure 11C:
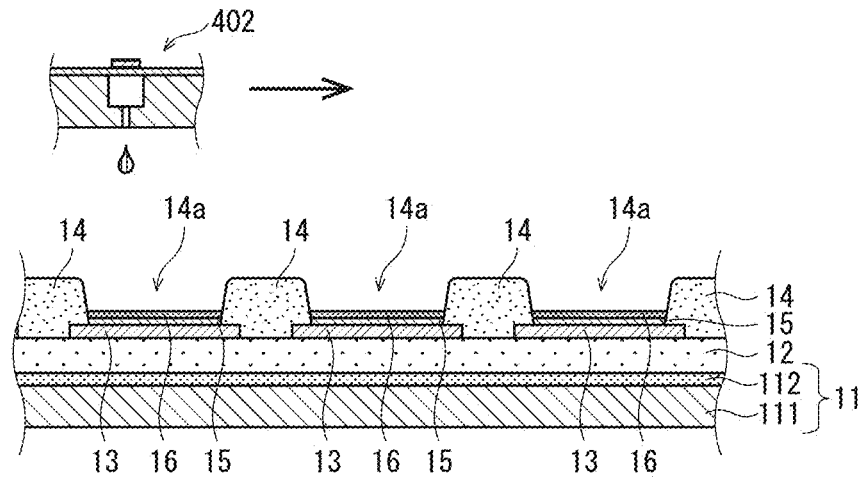

Next, as illustrated in FIG. 11C, ink containing constituent material of the hole transport layers 16 is ejected from nozzles of an inkjet head 402 into the apertures 14a defined by the banks 14 to be applied onto the hole injection layers 15 in the apertures 14a, then baked (dried) to form the hole transport layers 16 (step S60).

(6) Forming Light Emitting Layers 17

Figure 12A:
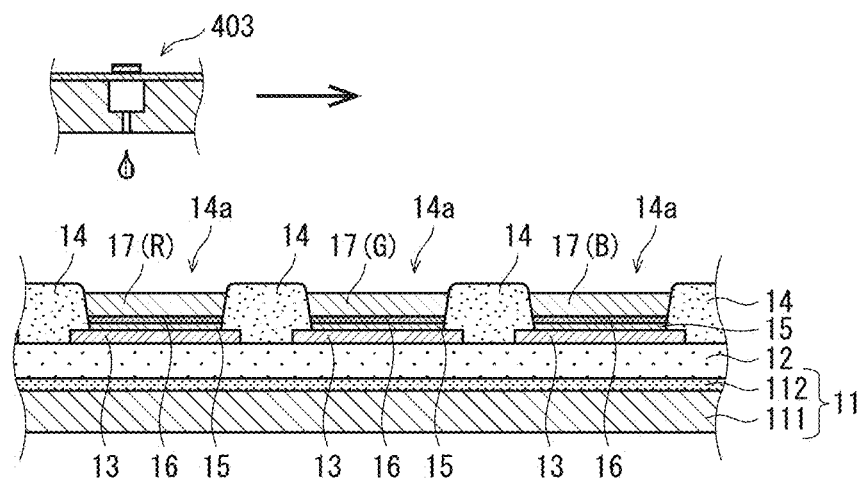
FIG. 12A, 12B, 12C are partial cross section diagrams schematically illustrating part of the process of manufacturing the organic EL element according to at least one embodiment, where

Next, as illustrated in FIG. 12A, ink containing constituent material of the light emitting layers 17 is ejected from nozzles of an inkjet head 403 to be applied onto the hole transport layers 16 in the apertures 14a, then baked (dried) to form the light emitting layers 17 (step S70).

(7) Forming First Electron Transport Layer 18

Figure 12B:
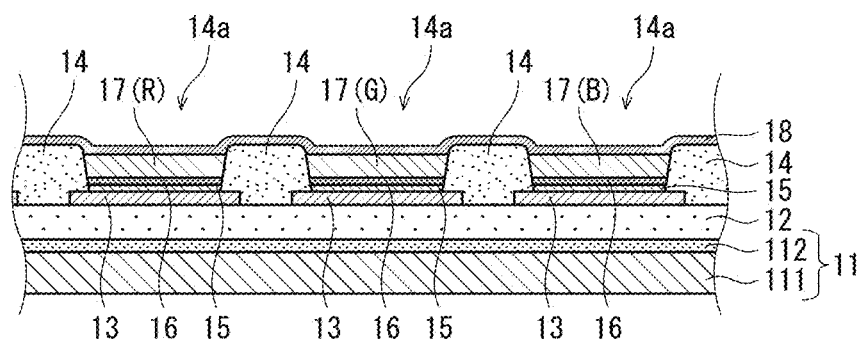

Next, as illustrated in FIG. 12B, the first electron transport layer 18 is formed on the light emitting layers 17 and the banks 14 (step S80). The first electron transport layer 18 is formed, for example, by forming a film common to every sub pixel by vapor deposition of an organic compound as a material of the first electron transport layer 18.

(8) Forming Second Electron Transport Layer 19

Figure 12C:
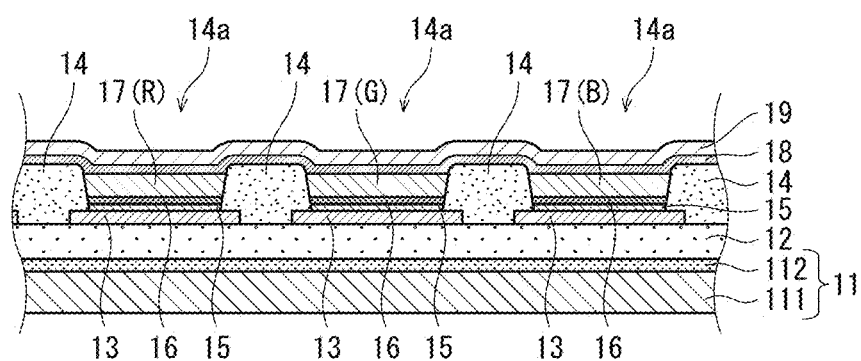

Next, as illustrated in FIG. 12C, the second electron transport layer 19 is formed on the first electron transport layer 18 (step S90). The second electron transport layer 19 is formed, for example, by forming a film common to every sub pixel by vapor deposition of an electron transporting organic compound and a metal dopant.

(9) Forming Optical Adjustment Layer 20

Figure 13A:
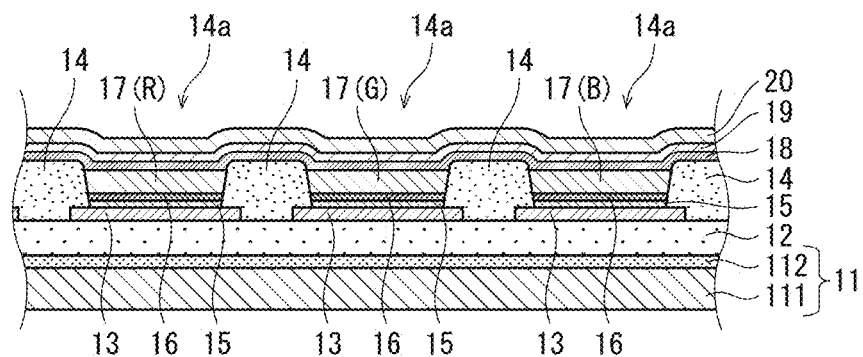
FIG. 13A, 13B, 13C are partial cross section diagrams schematically illustrating part of the process of manufacturing the organic EL element according to at least one embodiment, where
Figure 14:
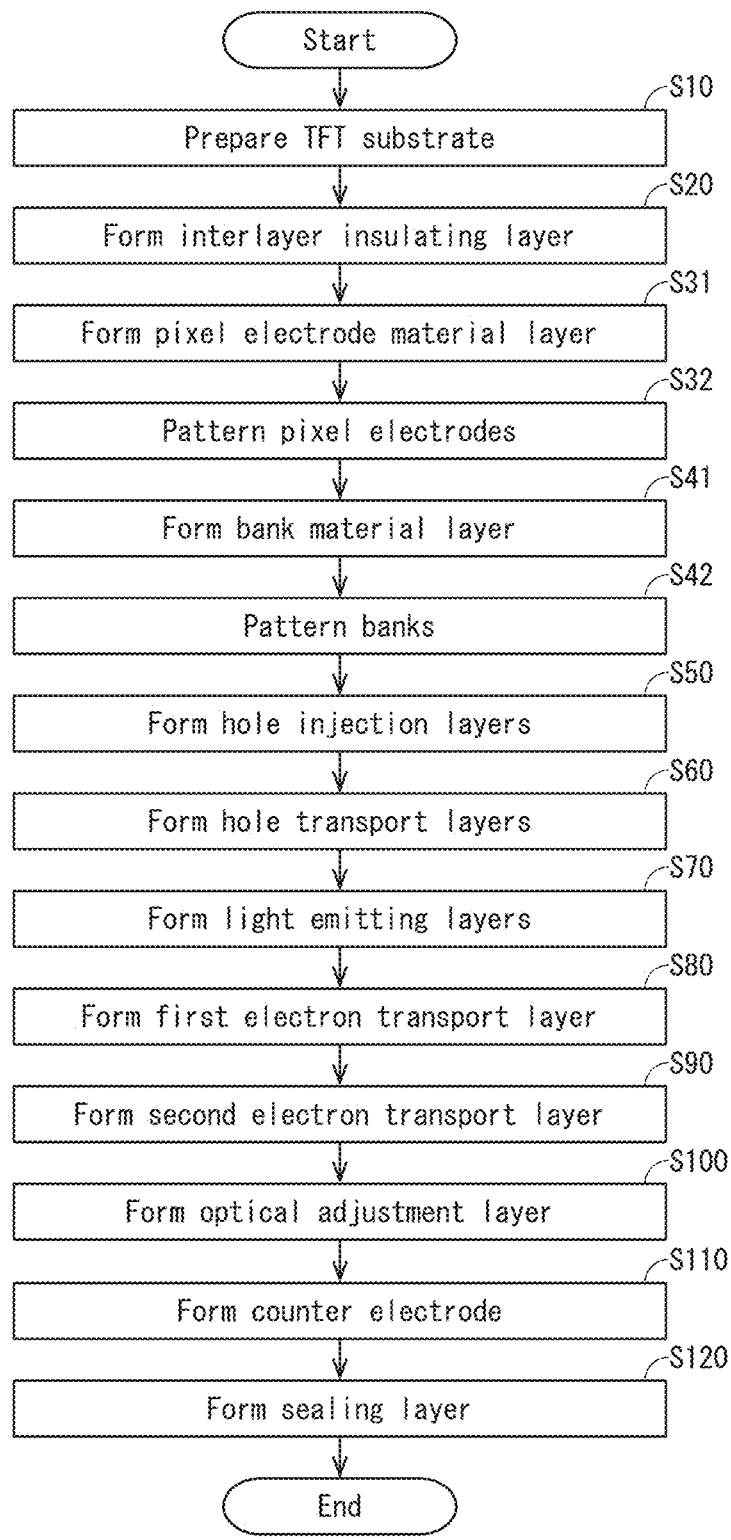
FIG. 14 is a flowchart illustrating the process of manufacturing the organic EL element according to at least one embodiment.

Next, as illustrated in FIG. 13A, the optical adjustment layer 20 is formed on the second electron transport layer 19 (step S100). The optical adjustment layer 20 is formed, for example, by forming a film common to every sub pixel by vapor deposition or sputtering of an oxide conductor such as IZO, ITO, or the like.

(10) Forming Counter Electrode 21

Figure 13B:
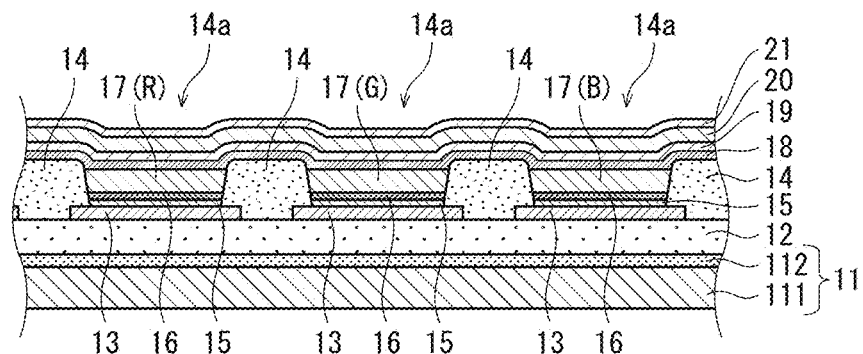

Next, as illustrated in FIG. 13B, the counter electrode 21 is formed on the optical adjustment layer 20 (step S110). The counter electrode 21 is formed by forming a film of silver, aluminum, or the like by a sputtering method or a vacuum vapor deposition method. The counter electrode 21 functions as a cathode of the organic EL elements.

(11) Forming Sealing Layer 22

Figure 13C:
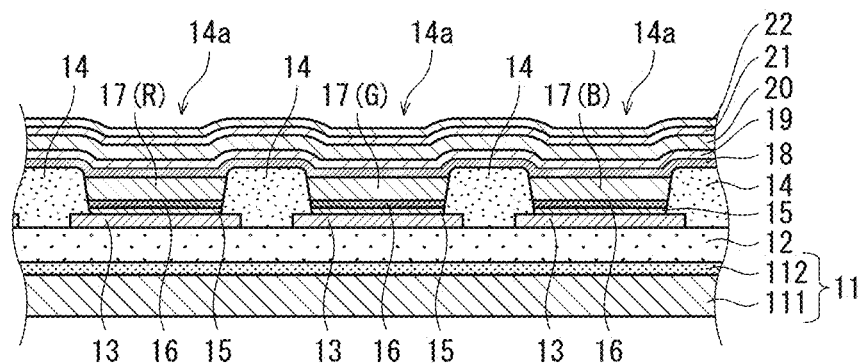

Finally, as illustrated in FIG. 13C, the sealing layer 22 is formed on the counter electrode 21 (step S120). The sealing layer 22 can be formed by forming a film of SiON, SiN, or the like by a sputtering method, a CVD method, or the like. A sealing resin layer may be further applied on an inorganic film of SiON, SiN, or the like, and formed by baking or the like.

A color filter or an upper substrate may be placed on the sealing layer 22 and bonded.

6. Overall Structure of Organic EL Display Device

Figure 15:
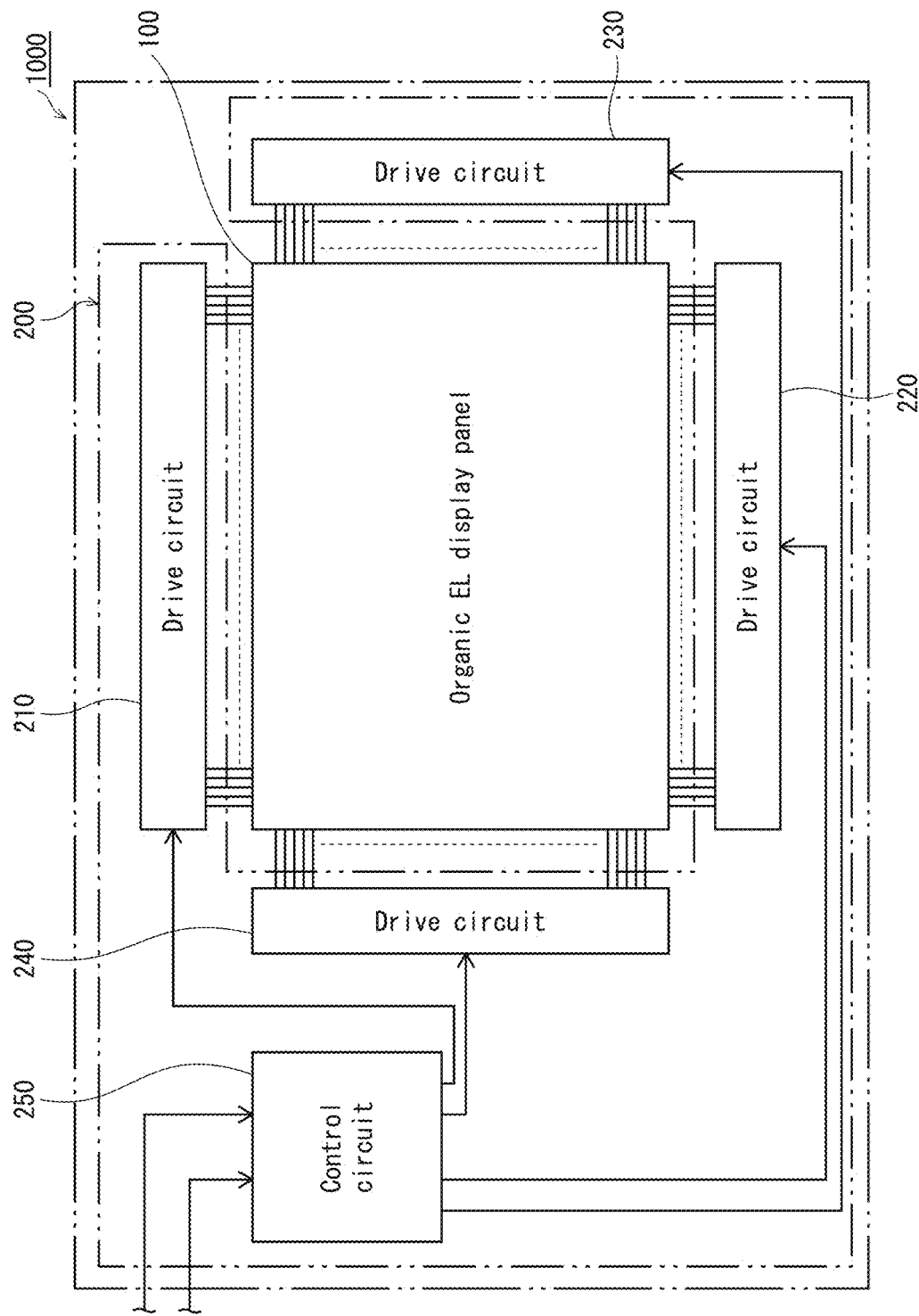
FIG. 15 is a block diagram illustrating a structure of an organic EL display device including organic EL elements according to at least one embodiment.

FIG. 15 is a schematic block diagram illustrating structure of an organic EL display device 1000 including the organic display panel 100. As illustrated in FIG. 15, the organic EL display device 1000 includes the organic EL display panel 100 and a drive controller 200 connected to the organic EL display panel 100. The drive controller 200 includes four drive circuits 210, 220, 230, 240 and a control circuit 250.

In the organic EL display device 1000, arrangement of the drive controller 200 with respect to the organic EL display panel 100 is not limited to the example illustrated.

7. Other Modifications (1) According to at least one embodiment, in order to prevent deterioration of the hole transport layer 16, the hole injection barrier Hg(htl) from the hole injection layer 15 to the hole transport layer 16 is specified according to a design, and film thickness of the hole transport layer 16 is specified according to a design. However, in order to prevent deterioration of the first electron transport layer 18, the electron injection barrier Eg(etl1) from the second electron transport layer 19 to the first electron transport layer 18, and film thickness of the first electron transport layer 18 may be specified according to a design.

Figure 16A:
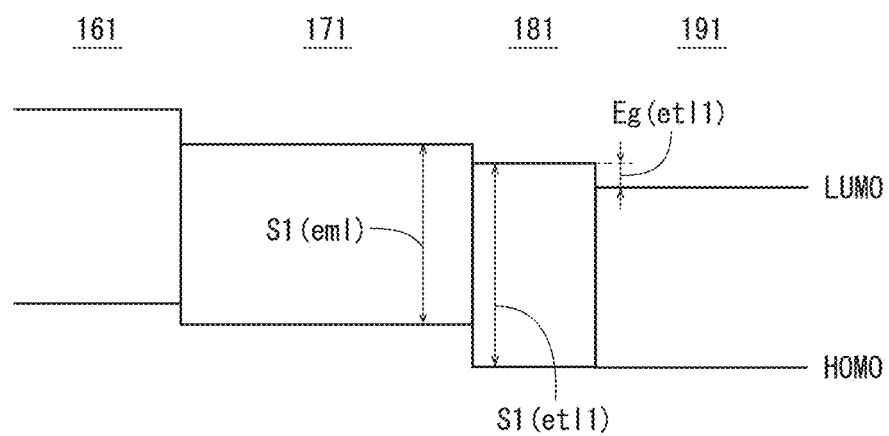
FIG. 16A, 16B are simplified schematic diagrams illustrating a relationship between electron and hole recombination position and a band diagram of a hole transport layer, light emitting layer, first electron transport layer, and second electron transport layer of a modification.
Figure 16B:
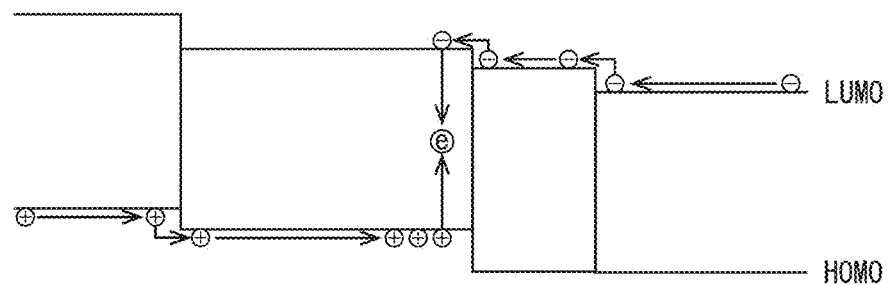

FIG. 16A is a band diagram according to a modification. In this case, the electron injection barrier Eg(etl1) from the second electron transport layer 19 to the first electron transport layer 18 is set to 0.2 eV or more. That is, materials of the first electron transport layer 18 and the second electron transport layer 19 are selected such that the LUMO level 191 of the second electron transport layer 19 is 0.2 eV higher than the LUMO level 181 of the first electron transport layer 18. According to the above structure, as illustrated in the schematic diagram of FIG. 16B, electron density of the first electron transport layer 18 can be reduced without reducing electron density of the light emitting layer 17, and deterioration of the first electron transport layer 18 due to deactivation reactions caused by electrons and excitons can be suppressed. In this case also, drive voltage increases due to increase in impedance of the first electron transport layer 18, but the increase in drive voltage can be suppressed by thinning film thickness of the first electron transport layer 18.

Further, structures of both an embodiment and a modification may be adopted at the same time.

(2) According to at least one embodiment, the light emitting layer 17 is made of a single organic light emitting material, but the present invention is not limited to this. For example, the light emitting layer 17 may be made of a plurality of materials, including a fluorescent material, a host material, and the like.

(3) According to at least one embodiment, the first electron transport layer 18 and the second electron transport layer 19 are considered essential structure, but the present invention is not limited to this. For example, an organic EL element having a single electron transport layer may be used. Further, an additional functional layer may be provided. For example, a functional layer containing an oxide of a transition metal may be provided between the pixel electrode and the hole injection layer 15, and a functional layer containing an alkali metal, alkaline earth metal, fluoride of a rare earth metal, or quinolinium complex may be provided between the first electron transport layer 18 and the light emitting layer 17.

Further, the optical adjustment layer 20 is not an essential structure, and an organic EL element without the optical adjustment layer 20 may be used. Further, position of the optical adjustment layer 20 is not limited to described embodiments, and may be, for example, between the light emitting layer 17 and the first electron transport layer 18, or between the counter electrode 21 and the sealing layer 22.

(4) According to at least one embodiment, the organic EL display panel has a top emission structure, but a bottom emission structure may be used by using a light transmissive electrode as an anode and a light reflecting electrode as a cathode.

Further, according to at least one embodiment, the anode is a pixel electrode and the cathode is a counter electrode, but the cathode may be a pixel electrode and the anode may be a counter electrode.

Although the organic EL display panel and the organic EL display device pertaining to the present disclosure have been described based on the embodiments and modifications above, the present disclosure is not limited to the embodiment and modifications described above. For example, various embodiments and modifications achievable by a person having ordinary skill in the art, and any combination of elements and functions of embodiments and modifications that do not depart from the spirit of the present invention are also included in the present invention.

The invention claimed is:

1. An organic electroluminescence (EL) element comprising:
    an anode;
    a first functional layer including an organic and polymeric material disposed above the anode;
    a second functional layer including an organic and polymeric material disposed on and in contact with the first functional layer;
    a light emitting layer disposed on and in contact with the second functional layer; and
    a cathode disposed above the light emitting layer, wherein
    a highest occupied molecular orbital (HOMO) level of the material of the second functional layer is lower than that of a HOMO level of the material of the first functional layer,
    an energy gap between the first functional layer and the second functional layer is 0.2 eV or more, and
    a film thickness of the second functional layer is 15 nm or less.

2. The organic EL element of claim 1, wherein a hole mobility of the second functional layer is at least $1 \times 10^{-9}$ cm$^2$/Vs.

3. The organic EL element of claim 1, wherein an electron mobility in the light emitting layer is larger than a hole mobility in the light emitting layer.

4. The organic EL element of claim 1, wherein an energy of singlet excitons in the material of the second functional layer is larger than an energy of singlet excitons in a functional material included in the light emitting layer.

5. The organic EL element of claim 1, wherein an energy of triplet excitons in the material of the second functional layer is larger than an energy of triplet excitons in a functional material included in the light emitting layer.

6. The organic EL element of claim 1, wherein
    the anode is a light reflective electrode, and
    a distance between a light emitting layer side surface of the anode and an anode side surface of the light emitting layer is 40 nm or less.

7. The organic EL element of claim 6, wherein
    an optical cavity structure including a light transmissive layer is formed between the light emitting layer side surface of the anode and a light emitting layer side surface of the cathode, and
    the light transmissive layer includes indium tin oxide (ITO) or indium zinc oxide (IZO).

8. The organic EL element of claim 1, wherein
the HOMO level of the material of the second functional layer has an energy level no more than 0.6 eV lower than that of the HOMO level of the material of the first functional layer, and
the film thickness of the second functional layer is 5 nm or more.

9. An organic electroluminescence (EL) display panel comprising:
a plurality of the organic EL element of claim 1 disposed on a substrate.

* * * * *